(12) United States Patent
Sonoda et al.

(10) Patent No.: US 9,246,101 B2
(45) Date of Patent: Jan. 26, 2016

(54) DEPOSITION MASK, DEPOSITION APPARATUS, AND DEPOSITION METHOD

(75) Inventors: Tohru Sonoda, Osaka (JP); Nobuhiro Hayashi, Osaka (JP); Shinichi Kawato, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 646 days.

(21) Appl. No.: 13/583,611

(22) PCT Filed: Oct. 29, 2010

(86) PCT No.: PCT/JP2010/006416
§ 371 (c)(1),
(2), (4) Date: Sep. 7, 2012

(87) PCT Pub. No.: WO2011/111134
PCT Pub. Date: Sep. 15, 2011

(65) Prior Publication Data
US 2012/0329188 A1    Dec. 27, 2012

(30) Foreign Application Priority Data

Mar. 9, 2010  (JP) .................. 2010-051313

(51) Int. Cl.
*H01L 21/00* (2006.01)
*B05C 13/02* (2006.01)
*B05C 21/00* (2006.01)
*B05C 11/11* (2006.01)
(Continued)

(52) U.S. Cl.
CPC .......... *H01L 51/0011* (2013.01); *C23C 14/042* (2013.01); *C23C 14/24* (2013.01); *H01L 27/3211* (2013.01); *H01L 51/56* (2013.01)

(58) Field of Classification Search
None
See application file for complete search history.

(56) References Cited

U.S. PATENT DOCUMENTS

| | | | |
|---|---|---|---|
| 6,495,010 B2 * | 12/2002 | Sferlazzo | ................ 204/298.27 |
| 2004/0144317 A1 * | 7/2004 | Chuman et al. | ................ 118/721 |
| 2008/0018236 A1 * | 1/2008 | Arai et al. | ...................... 313/504 |

FOREIGN PATENT DOCUMENTS

| | | |
|---|---|---|
| JP | 57-26163 A | 2/1982 |
| JP | 9-165669 A | 6/1997 |

(Continued)

OTHER PUBLICATIONS

Japanese unpublished Patent Application No. 2009-213570, filed on Sep. 15, 2009, Sonoda et al., titled "Vapor Deposition Method and Vapor Deposition Apparatus", 62 pages (Corresponds to WO 2011/034011 A1).

(Continued)

*Primary Examiner* — Calvin Choi
(74) *Attorney, Agent, or Firm* — Morrison & Foerster LLP

(57) ABSTRACT

A deposition mask is used to pattern a thin film 3 on a substrate 10 by depositing deposition particles through a plurality of openings K having a stripe pattern. The deposition mask includes a frame 65; a plurality of mask layers 70 provided in the frame so as to overlap each other; and a support layer 71 provided between the mask layers 70. Each of the mask layers 70 is formed by arranging a plurality of mask wires 72 in a stripe pattern in a tensioned state, and the support layer 71 is formed by arranging a plurality of support wires 74 in a tensioned state so as to cross the mask wires 72. A plurality of gaps 73 in each of the plurality of mask layers 70 overlap each other to form a plurality of through gaps 73*a* that linearly extend through all of the plurality of mask layers 70. The openings K are formed by the through gaps 73*a*.

14 Claims, 17 Drawing Sheets

(51) Int. Cl.
*H01L 51/00* (2006.01)
*C23C 14/04* (2006.01)
*C23C 14/24* (2006.01)
*H01L 27/32* (2006.01)
*H01L 51/56* (2006.01)

(56) References Cited

FOREIGN PATENT DOCUMENTS

| | | |
|---|---|---|
| JP | 10-102237 A | 4/1998 |
| JP | 2000-182767 A | 6/2000 |
| JP | 2003-231961 A | 8/2003 |
| JP | 2003-272838 A | 9/2003 |
| JP | 2004-225126 A | 8/2004 |
| WO | 2011/034011 A1 | 3/2011 |

OTHER PUBLICATIONS

International Search Report received for PCT Patent Application No. PCT/JP2010/006416, mailed on Jan. 25, 2011, 5 pages (2 pages of English translation and 3 pages of Search Report).

* cited by examiner

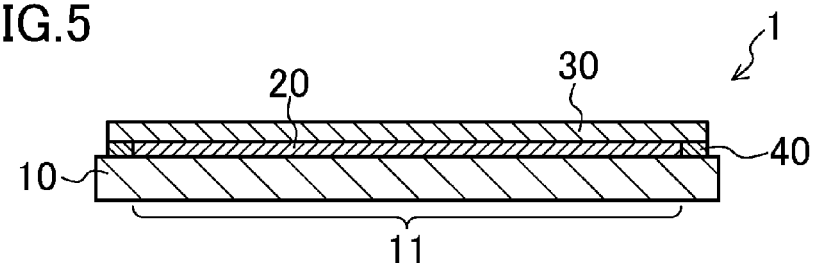
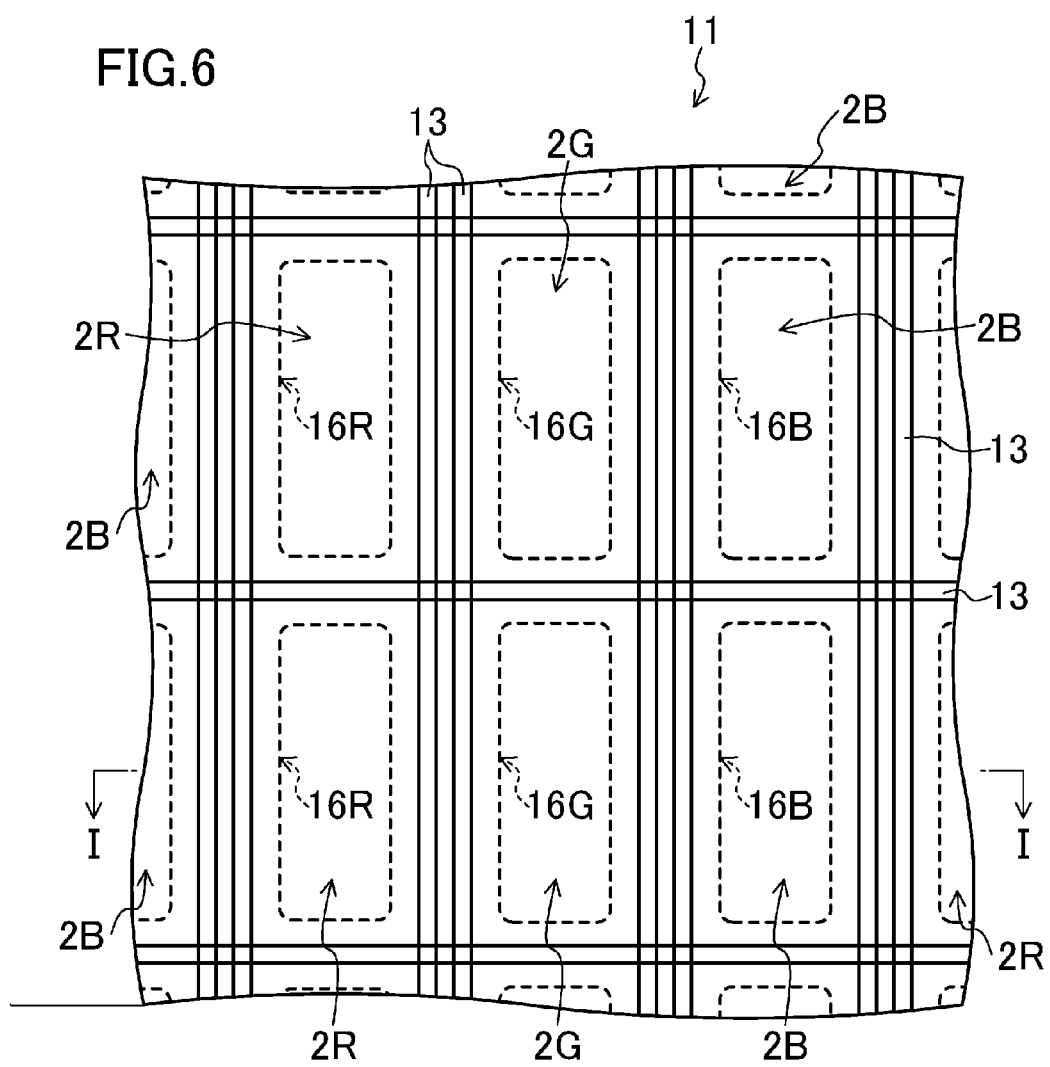

DEPOSITION MASK, DEPOSITION APPARATUS, AND DEPOSITION METHOD

CROSS REFERENCE TO RELATED APPLICATIONS

This is a U.S. National Phase patent application of PCT/JP2010/006416, filed Oct. 29, 2010, which claims priority to Japanese Patent Application No. 2010-051313, filed Mar. 9, 2010, each of which is hereby incorporated by reference in the present disclosure in its entirety.

TECHNICAL FIELD

The present invention relates to deposition masks that are preferably used for, e.g., large-sized organic EL (Electro Luminescence) displays etc.

BACKGROUND ART

In recent years, a larger size, higher image quality, and lower power consumption have been required for flat panel displays, and high image quality organic EL displays capable of being driven at a low voltage have received considerable attention. The organic EL displays have the following structure. For example, in full color active matrix organic EL displays, thin film-like organic EL elements are provided on a substrate having thin film transistors (TFTs) thereon. In the organic EL element, organic EL layers including red (R), green (G), and blue (B) light-emitting layers are stacked between a pair of electrodes, and each light-emitting layer emits light in response to a voltage applied between the electrodes. This light is used to display an image.

In manufacture of such organic EL displays, thin films such as light-emitting layers and electrodes are patterned by using a technique such as a vacuum deposition method, an ink jet method, or a laser transfer method. For example, in low molecular organic EL displays (organic light-emitting diodes (OLED)), the vacuum deposition method is mainly used to pattern the light-emitting layers.

In the vacuum deposition method, a mask having a predetermined opening patterned therethrough is normally fixed to a substrate in close contact therewith, and is placed in a vacuum chamber so that the mask side of the substrate faces a deposition source. Then, a film-forming material is deposited from the deposition source to a desired position on the substrate through the opening of the mask. A thin film such as the light-emitting layers is patterned in this manner. The light-emitting layer of each color is separately deposited color by color (separate deposition). In particular, a mass production process uses a mask (a full contact shadow mask) having the same size as the substrate, and the substrate having the mask in close contact therewith is typically fixed at a predetermined position with respect to the deposition source when performing deposition.

A vacuum deposition method is also known, in which deposition is performed while relatively moving a substrate etc. with respect to a deposition source (Patent Document 1). In Patent Document 1, a mask is used in which a plurality of small holes or long slit holes having a smaller area than an electrode to be formed are formed at predetermined intervals. Deposition is performed while moving the mask in a direction crossing the direction in which the small holes etc. are arranged, whereby the electrode having a predetermined pattern is formed.

Regarding the present invention, a deposition mask is disclosed which is formed by using fibers (Patent Document 2). Specifically, resin single fibers are provided in a stripe pattern in an opening portion of a rectangular frame. Each resin single fiber is formed by a single large-diameter single fiber and two small-diameter single fibers. The two small-diameter single fibers are bonded to the frame at a pitch smaller than the diameter of the large-diameter single fiber. The large-diameter single fiber is placed between the two small-diameter single fibers and bonded to the frame.

CITATION LIST

Patent Document

PATENT DOCUMENT 1: Japanese Patent Publication No. H10-102237
PATENT DOCUMENT 2: Japanese Patent Publication No. 2000-182767

SUMMARY OF THE INVENTION

Technical Problem

In the case of patterning light-emitting layers etc. by a vacuum deposition method in a conventional mass production process, the mask size increases as the substrate size increases. Accordingly, a gap tends to be produced between the substrate and the mask due to bending or extension of the mask which is caused by its own weight. This makes it difficult to perform accurate patterning, and thus to implement higher definition due to displacement of the deposition position or color mixture.

As the substrate size increases, the size of the mask, a frame holding the mask, etc. becomes enormous, and the weight thereof increases accordingly. Thus, it is difficult to handle them, which may adversely affect productivity and safety. Associated apparatuses are similarly increased in size and become complicated, whereby it is difficult to design the apparatuses, and installation cost becomes very high.

Accordingly, it is difficult to apply the conventional vacuum deposition method to large substrates, and no method has been implemented which allows patterning to be performed on large substrates of, e.g., more than 60 inches by mass production.

The inventor has proposed a deposition method that can be applied to such large substrates (hereinafter also referred to as the "new deposition method") (Japanese Patent Application No. 2009-213570).

Specifically, this deposition method uses a mask unit that is formed by integrating a deposition source and a shadow mask having a smaller area than a substrate. With the shadow mask and the substrate being held with a constant gap therebetween, deposition is performed while relatively scanning the mask unit with respect to the substrate. This avoids the above problems associated with the increased substrate size, and allows patterning to be performed on a large substrate by deposition in a mass production process.

However, the amount of undesirable deposition in a patterned thin film tends to be increased in the new deposition method.

FIG. 1 is a schematic view showing a deposition process in the new deposition method. In the figure, the reference character "101" represents a substrate, "102" represents a deposition mask, "102*a*" represents an opening, "103" represents a deposition source, "103*a*" represents an emission port through which deposition particles are emitted, and "110" represents a thin film such as a light-emitting layer formed on the substrate. The deposition mask 102 and the deposition source 103 are used as a unit, and are held in a fixed relative positional relation. An arrow represents a relative scanning direction of the deposition mask 102 etc. with respect to the substrate 101.

In the new deposition method, deposition is performed with a constant gap between the deposition mask 102 and the substrate 101. Accordingly, as shown in FIG. 2, some of the deposition particles that obliquely pass through the opening of the deposition mask are deposited on a portion outside a deposition region r1 (a region facing the opening of the deposition mask), causing undesirable deposition in a direction perpendicular to the scanning direction. The light-emitting layer etc. functions as a light-emitting region of a pixel. Thus, color mixture and degradation in characteristics are caused if such undesirable deposition extends to a light-emitting region of an adjoining pixel. Accordingly, it is preferable to reduce undesirable deposition as much as possible. As used herein, the term "undesirable deposition" refers to the thin film 110 that is formed outside the deposition region r1, as shown in FIG. 2.

Undesirable deposition can be reduced by reducing the gap between the deposition mask 102 and the substrate 101. For example, as shown in FIG. 3, since the deposition particles fly with directionality, the width of undesirable deposition (the undesirable deposition width B) is represented by "P×tanγ," where "γ" represents an angle (an incident angle) at which the deposition particles are directed to the substrate 101 with respect to an axis perpendicular to the substrate 101 and the deposition mask 102 (this axis is also referred to as a deposition axis L1) as viewed from the scanning direction, and "P" represents a distance between the deposition mask 102 and the substrate 101 in the vertical direction. Thus, undesirable deposition increases as the gap between the deposition mask 102 and the substrate 101 increases. Undesirable deposition decreases as the gap between the deposition mask 102 and the substrate 101 decreases. Accordingly, it is preferable to place the deposition mask 102 and the substrate 101 as close to each other as possible.

Precise control of the deposition mask 102 and the substrate 101 is required in order to place the deposition mask 102 and the substrate 101 at the smallest possible distance of, e.g., several tens of micrometers etc. and to perform scanning without allowing the deposition mask 102 and the substrate 101 to contact each other. However, it is difficult to stably perform such control. In particular, in the case of large substrates 101, it is difficult to perform such control in practical applications.

Another method to reduce undesirable deposition is to reduce the incident angle γ. The incident angle γ is limited by either the emission angle at which the deposition particles are emitted through the emission port 103a or the passing angle at which the deposition particles pass through the opening 102a (both the emission angle and the passing angle are angles with respect to the deposition axis L1). Since the opening 102a has a very small width, the passing angle is normally smaller than the emission angle, and the incident angle γ is typically limited by the passing angle.

As shown in FIG. 4, the maximum value of the passing angle is affected by the cross-sectional aspect ratio of the opening 102a of the deposition mask 102. The cross-sectional aspect ratio is a value determined by the width, depth, cross-sectional shape, etc. of the opening 102a. The cross-sectional aspect ratio is represented by the ratio (f/h) of the depth dimension "f" to the width dimension "h" in a cross section of the opening 102a extending perpendicularly to the mask surface as viewed from the scanning direction. In this case, as shown in FIG. 4, the maximum value of the passing angle is smaller in the deposition mask 102 having a high cross-sectional aspect ratio (f2/h) shown by two-dot chain line than in the deposition mask 102 having a low cross-sectional aspect ratio (f1/h) shown by solid line.

Accordingly, in order to reduce undesirable deposition, it is effective to increase the cross-sectional aspect ratio of the opening of the deposition mask. Possible methods to increase the cross-sectional aspect ratio include, e.g., accurately forming the cross-sectional shape of the opening, increasing the thickness of the deposition mask, etc.

For example, the cross-sectional shape of the opening can be accurately formed by using an electroforming method, a drilling method with laser cutting, etc. However, it is difficult to accurately process the cross-sectional shape of the opening on the order of micrometers, if the depth of the opening is larger than the width thereof, such as in the case where an opening having a width of 100 μm is formed in a deposition mask having a thickness of 300 μm.

Moreover, increasing the thickness of the deposition mask increases the weight of the deposition mask itself accordingly, and thus tends to cause bending of the deposition mask due to the weight of the deposition mask itself. Such bending of the deposition mask makes the gap between the deposition mask and the substrate unstable. Increasing the size of the deposition mask makes it difficult to handle the deposition mask and to control the deposition mask in a deposition apparatus.

Accordingly, with the structures of conventional deposition masks, an opening having a high cross-sectional aspect ratio, which is effective to reduce undesirable deposition, cannot be implemented in practical applications.

It is an object of the present invention to provide a deposition mask etc. which can effectively reduce undesirable deposition by a practical method and which allows high quality, high definition, large-sized organic EL displays to be manufactured.

Solution to the Problem

In order to achieve the above object, the present invention was developed in terms of the shape, positioning, etc. of a deposition mask.

For example, a deposition mask of the present invention is a deposition mask that is used to form a thin film in a prescribed pattern on a substrate by depositing deposition particles through a plurality of openings having a stripe pattern. The deposition mask includes: a frame-shaped mask support body; a plurality of mask layers provided in a frame of the mask support body so as to overlap each other; and a support layer provided between the mask layers. Each of the plurality of mask layers is formed by arranging in a stripe pattern a plurality of mask wires in a same direction in a tensioned manner on the mask support body. The support layer is formed by arranging a plurality of support wires in a tensioned manner on the mask support body so as to cross the mask wires. The plurality of gaps in each of the plurality of mask layers overlap each other to form a plurality of through gaps that linearly extend through all of the plurality of mask layers, and the plurality of openings are formed by the plurality of through gaps.

The plurality of mask layers, each formed by the mask wires, are stacked in this deposition mask. The support layer, which is formed by the plurality of support wires crossing the mask wires, is provided between the mask layers. The gaps having a stripe pattern in each mask layer are placed to overlap each other to form the plurality of through gaps that linearly extend through the mask layers. The plurality of openings are formed by the plurality of through gaps.

According to this deposition mask, the openings are formed by stacking the mask layers etc. This eliminates the need to form the openings by forming holes in a metal plate, as in the conventional deposition masks. Since the thickness dimension of the deposition mask can be increased by increasing the number of mask layers to be stacked, a high cross-sectional aspect ratio can be easily implemented. Thus, undesirable deposition can be effectively reduced, and high quality, high definition, large-sized organic EL displays can be manufactured.

Moreover, a deposition mask having a different cross-sectional aspect ratio and a different pitch can be obtained by merely adjusting the size of the gaps and the sizes of the mask wires and the support wires. Thus, a fine thin film can be patterned as desired. Furthermore, since the deposition mask has a hollow space in the support layer, the weight of the deposition mask can be reduced as compared to the conventional deposition masks in which the openings are formed by forming holes in a metal plate.

Moreover, although a large metal plate is required in order to increase the size of the conventional deposition masks, the size of this deposition mask can be relatively easily increased by merely changing the lengths of the mask wires and the support wires and attaching the mask wires and the support wires to the mask support body. Since the mask wires are supported by the plurality of support wires crossing the mask wires, displacement can be effectively suppressed even if the size of the deposition mask is increased.

Specifically, the plurality of gaps may be separated from each other by one of the mask wires.

This simplifies the structure of the deposition mask. Thus, processing of the deposition mask is facilitated, and the deposition mask has a stable quality.

The plurality of gaps may be separated from each other by multiple ones of the mask wires (this mask is also referred to as the "second improved mask").

Even if the width and pitch of the openings are changed in this mask, the number of mask wires can be changed accordingly, which eliminates the need to prepare mask wires having different dimensions. This can reduce the number of materials, and thus can reduce manufacturing cost.

Alternatively, the plurality of support wires may be arranged in a staggered manner with respect to the plurality of mask wires.

Thus, since the plurality of support wires placed in a tensioned state are arranged in a staggered manner with respect to the plurality of mask wires placed in a tensioned state, support of the mask wires by the support wires is strengthened, and displacement of the mask wires can further be prevented.

In particular, these deposition masks provide a significant advantage when combined with a deposition apparatus used in the new deposition method.

An example of such a deposition apparatus is a deposition apparatus including: any of these deposition masks; a deposition source that emits the deposition particles; a mask unit that includes the deposition mask and the deposition source, and maintains a fixed relative positional relation between the deposition mask and the deposition source; a substrate support apparatus that supports the substrate; and a moving apparatus that relatively moves at least one of the mask unit and the substrate along a predetermined scanning direction with a constant gap being provided between the substrate and the deposition mask, wherein the deposition mask is placed so that a direction in which the openings extend is parallel to the scanning direction.

The deposition apparatus having such a configuration can deposit the thin film on the substrate while effectively reducing undesirable deposition, regardless of the size of the substrate. Thus, high quality, high definition, large-sized organic EL displays can be stably manufactured, and mass production of such organic EL displays can be implemented.

In this deposition apparatus, the plurality of mask wires and the plurality of support wires are preferably set so that of the deposition particles that enter the gap in the outermost mask layer located on a side of the deposition source, the deposition particles other than those emitted through the gap in the outermost mask layer located on a side of the substrate, which overlaps the gap in the outermost mask layer located on the side of the deposition source, are caught by either the mask layer or the support layer.

In this case, the deposition particles that enter the inlets of the gaps (the openings) in the deposition mask are emitted from the outlets of these gaps (the openings), whereby only the gaps (the through gaps) can be made to function as the openings. This can prevent unexpected deposition, whereby high quality patterning can be implemented.

Specifically, the plurality of mask layers may include a first mask layer and a second mask layer from the side of the deposition source, and a minimum passing angle at which the deposition particles pass through a space (also referred to the "interlayer space") between a portion between adjoining two of the gaps in the first mask layer and a portion between adjoining two of the gaps in the second mask layer, which overlaps the portion between the adjoining two gaps in the first mask layer, may be larger than a maximum passing angle at which the deposition particles pass through the gap in the first mask layer, with respect to a reference line perpendicular to the deposition mask, as viewed in the scanning direction.

In this case, the deposition particles that enter the interlayer space hit the mask wires or the support wires, and the deposition particles can be prevented from being emitted to the side of the substrate. Thus, only the deposition particles that enter the inlets of the gaps (the through gaps) are emitted from the outlets thereof, whereby the gaps (the through gaps) can be substantially made to function as the openings.

The deposition apparatus preferably further includes: a plurality of mask layers stacked next to the second mask layer on the side of the substrate, and a minimum passing angle at which the deposition particles pass through a space between a portion between adjoining two of the gaps in the $N^{th}$ mask layer and a portion between adjoining two of the gaps in the $(N+1)^{th}$ mask layer, which overlaps the portion between the adjoining two gaps in the $N^{th}$ mask layer, is preferably larger than a maximum passing angle at which the deposition particles pass through the through gap from the first mask layer to the $N^{th}$ mask layer, with respect to the reference line perpendicular to the deposition mask, as viewed in the scanning direction.

This shows a case where the deposition mask has three or more mask layers. In this case as well, as in the case where the deposition mask has two mask layers, the deposition particles entering each interlayer space hit the mask wires or the support wires, and thus are prevented from being emitted from the side of the substrate. Thus, the gaps (the through gaps) can be substantially made to function as the openings even if the number of mask layers is increased.

In the case where the second improved mask described above is used as the deposition mask, a deposition apparatus may include: this deposition mask; a deposition source that emits the deposition particles; a mask unit that includes the deposition mask and the deposition source, and maintains a fixed relative positional relation between the deposition mask and the deposition source; a substrate support apparatus that supports the substrate; and a moving apparatus that relatively moves at least one of the mask unit and the substrate along a predetermined scanning direction with a constant gap being provided between the substrate and the deposition mask, wherein the deposition mask may be placed so that a direction in which the openings extend is parallel to the scanning direction, and an adjusting gap that blocks a passage of the deposition particles may be formed in a portion between adjoining two of the gaps in at least the outermost one of the plurality of mask layers, which is located on a side of the deposition source.

In the case of the second improved mask, if the width of the region between the adjoining two gaps is an integral multiple of the width dimension of the mask wire, the plurality of mask wires can be arranged in close contact with each other. Thus, no unnecessary gap is produced. In other cases, however, an unnecessary gap may be produced due to the difference in dimensions, and the deposition particles may be unexpectedly deposited through this gap.

In such cases, the adjusting gap is formed which blocks the passage of the deposition particles. This can prevent deposition due to the unnecessary gap, and allows only the through gaps to function as the openings.

Specifically, the plurality of mask wires may be arranged so that the deposition particles that enter the adjusting gap are caught by either the mask layer or the support layer.

Thus, the passage of the deposition particles can be blocked by merely adjusting the arrangement of the mask wires. This is advantageous in terms of cost because no separate member or no processing is required. Moreover, forming the adjusting gap facilitates formation of a hollow space, and thus can further reduce the weight of the deposition mask.

The adjusting gap may be closed by a sealing member.

Closing the adjusting gap by the sealing member can reliably block the passage of the deposition particles, whereby stability can be ensured.

Such a deposition mask and a deposition apparatus provide great advantages in manufacture based on the new deposition method.

An example of such a deposition method is a deposition method for forming the thin film in a stripe pattern on the substrate by using any of these deposition apparatuses, including: an aligning step of, with the substrate being supported by the substrate support apparatus and with the gap being provided between the substrate and the deposition mask, aligning the mask unit and the substrate so that the mask unit faces the substrate; and a deposition step of forming the thin film by sequentially depositing the deposition particles while relatively moving at least one of the mask unit and the substrate along the predetermined scanning direction by the moving apparatus.

According to this deposition method, deposition with reduced undesirable deposition can be performed by merely performing a predetermined operation, regardless of the size of the substrate. Thus, this deposition method is preferable for a mass production process of large-sized organic EL displays.

In particular, the deposition method provides great advantages in the case where a substrate for an organic EL display in which a plurality of pixels each having a light-emitting region configured to emit light are arranged in a grid pattern is used as the substrate, the plurality of openings are placed so as to face a plurality of film formation pixels that are included in the plurality of pixels, and the deposition mask is positioned so that each of the light-emitting regions of the film formation pixels is located inside the opening in a lateral direction with a gap therebetween, as viewed in a direction perpendicular to the substrate.

Each of the light-emitting regions of the film formation pixels is located inside the opening with the gap therebetween. This can suppress defective formation of the thin film due to a difference in dimensions between the deposition mask and the substrate and misalignment therebetween, whereby productivity in a mass production process can be improved.

Advantages of the Invention

As described above, the deposition mask etc. of the present invention can effectively reduce undesirable deposition, and can implement mass production of high quality, high definition, large-sized organic EL displays.

BRIEF DESCRIPTION OF THE DRAWINGS

FIG. 5 is a schematic cross-sectional view showing an organic EL display in a first embodiment.

FIG. 6 is a schematic plan view showing a main part of a substrate.

DESCRIPTION OF EMBODIMENTS

Figure 1:
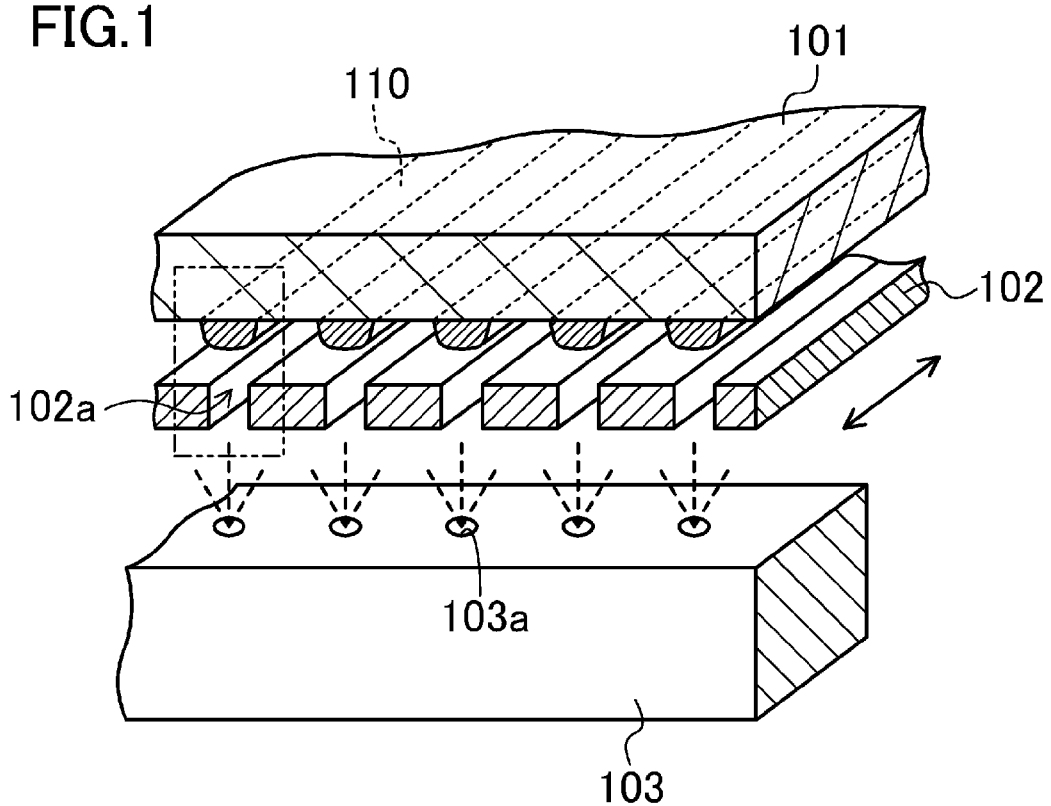
FIG. 1 is a schematic diagram showing an example of a deposition process in a new deposition method.

Embodiments of the present invention will be described in detail below with reference to the accompanying drawings. The following description is essentially by way of example only, and is not intended to limit the present invention, its applications, or its uses.

[First Embodiment]
(Organic EL Display)

The present embodiment is described with respect to an example in which the present invention is applied to manufacture of organic EL displays. An organic EL display of the present embodiment is an active matrix display that implements full color image display by controlling light emission of a plurality of pixels (sub-pixels 2R, 2G, 2B) of red (R), green (G), and blue (B) (also collectively referred to as "RGB").

As shown in FIG. 5, an organic EL display 1 of the present embodiment is formed by a substrate 10, a thin film-like organic EL element 20, a sealing plate 30, etc. The substrate 10 and the sealing plate 30 have a shape of a rectangular plate, and the organic EL element 20 is inserted therebetween and is enclosed and hermetically sealed by a sealing member 40 such as an adhesive. A central portion of the surface of the substrate 10 serves as a display region 11 that provides image display, and the organic EL element 20 is placed in the display region 11.

Figure 7:
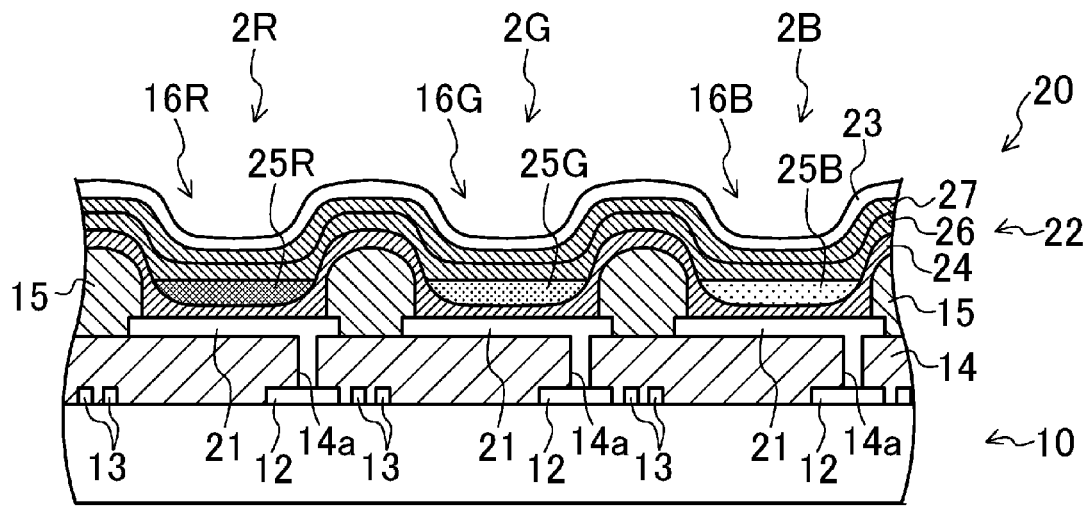
FIG. 7 is a schematic diagram showing a cross section taken along line I-I in FIG. 6.

As shown in FIGS. 6 and 7, thin film transistors (TFTs) 12, interconnects 13, an interlayer film 14, etc. are provided in the display region 11 of the substrate 10.

A glass plate etc. is used as the substrate 10. The substrate 10 is preferably transparent because the organic EL display 1 of the present embodiment is of a bottom emission type in which emitted light is output from the side of the substrate 10. However, the substrate 10 need not necessarily be transparent if the organic EL display 1 is of a top emission type. The interconnects 13 are patterned on the substrate 10, and are comprised of a plurality of gate lines extending parallel to each other, a plurality of signal lines crossing the gate lines and extending parallel to each other, etc. RGB sub-pixels 2R, 2G, 2B are arranged in a plurality of regions each surrounded by the interconnects 13 and forming a grid pattern. The TFTs 12 that control light emission are respectively provided in the sub-pixels 2R, 2G, 2B.

The RGB sub-pixels 2R, 2G, 2B are arranged so that the sub-pixels of the same color are arranged in line in a row direction and the RGB sub-pixels are arranged in a repeated pattern of RGB in a column direction. Each set of three sub-pixels 2R, 2G, 2B of RGB that are successively arranged in the column direction forms one pixel. As described in detail below, light-emitting layers 25R, 25G, 25B of the sub-pixels 2R, 2G, 2B are respectively formed by thin films 3 that are formed for each color so as to have a stripe pattern.

The interlayer film 14 is an insulating thin film of an acrylic resin etc., which functions also as a planarizing film. The interlayer film 14 is stacked over the entire display region 11 so as to cover the TFTs 12 etc. If the organic EL display 1 is of a bottom emission type, the interlayer film 14 is preferably transparent.

The organic EL element 20 is formed by first electrodes 21 (anodes), an organic EL layer 22, a second electrode 23 (a cathode), etc. The first electrodes 21 are comprised of, e.g., indium tin oxide (ITO) etc. An ITO film etc. is stacked on the interlayer film 14, and is patterned into the plurality of first electrodes 21 in a grid pattern corresponding to the sub-pixels 2. The first electrodes 21 are respectively connected to the TFTs 12 via contact holes 14a. An insulating edge cover 15 is stacked on the first electrodes 21. The edge cover 15 has light-emitting regions 16R, 16G, 16B formed as rectangular openings so as to correspond to the sub-pixels 2R, 2G, 2B, respectively. A large part of the first electrode 21 is exposed from the light-emitting region 16R, 16G, 16B, and the ends of the first electrode 21 are covered by the edge cover 15. Light emission of each pixel is output through these light-emitting regions 16R, 16G, 16B.

The organic EL layer 22 is provided between the first electrodes 21 and the second electrode 23. In the organic EL layer 22 of the present embodiment, a hole transport layer 24, light-emitting layers 25R, 25G, 25B, an electron transport layer 26, and an electron injection layer 27 are sequentially stacked from the side of the first electrodes 21. The hole transport layer 24 of the present embodiment also functions as a hole injection layer. The configuration of the organic EL layer 22 shown in the present embodiment is merely an example and is not limited to this, and the organic EL layer 22 may be formed by selecting and combining the layers as necessary. For example, a hole injection layer may be provided in addition to the hole transport layer 24, and a blocking layer may further be provided. The organic EL layer 22 need only include at least the light-emitting layers 25R, 25G, 25B. Known materials can be used as the materials of the hole transport layer 24, the light-emitting layers 25R, 25G, 25B, etc.

The hole transport layer 24, the electron transport layer 26, and the electron injection layer 27 are stacked over the entire display region 11. As described above, the light-emitting layers 25R, 25G, 25B have a stripe pattern corresponding to the sub-pixels 2 of each color. The second electrode 23 is stacked over the entire display region 11 so as to cover the organic EL layer 22.

(Basic Manufacturing Method of Organic EL Display 1)

Figure 8:
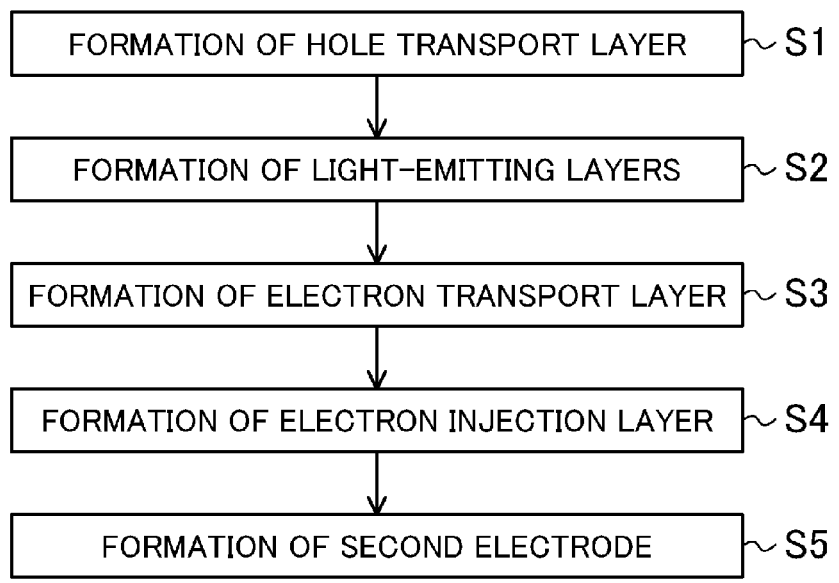
FIG. 8 is a flowchart showing a basic manufacturing process of the organic EL display.

A basic manufacturing method of the above organic EL display 1 will be described with reference to FIG. 8. FIG. 8 shows the step of forming the hole transport layer 24 etc. in the organic EL element 20 among the steps of the manufacturing method of the organic EL display 1.

First, the substrate 10 is prepared which has formed thereon the TFTs 12, the first electrodes 21, etc. (this substrate is also referred to as the "TFT substrate 10"). For example, a 500×400 mm rectangular glass plate having a thickness of about 1 mm can be used as a base of the TFT substrate 10. In this case, the interlayer film 14 can be formed with a thickness of about 2 μm, the first electrodes 21 can be formed with a thickness of about 100 nm, and the edge cover 15 can be formed with a thickness of about 1 μm. Since the TFT substrate 10 can be formed by a known method, description thereof is omitted.

The hole transport layer 24 is formed over the prepared TFT substrate 10 so as to cover the TFTs 12 etc. (step S1). Specifically, the material of the hole transport layer 24 is deposited over the entire display region 11. For example, a mask for the entire region, which has an opening of the same size as the display region 11, is bonded to the TFT substrate 10 so as to be in close contact therewith. The material of the hole transport layer 24 is deposited while rotating the TFT substrate 10 having thereon the mask for the entire region. For example, the hole transport layer 24 can be formed with a thickness of about 30 nm by using α-NPD. A conventional deposition apparatus can be used for this deposition process.

Next, the light-emitting layers 25R, 25G, 25B are stacked on the hole transport layer 24 (step S2). The light-emitting layers 25R, 25G, 25B of RGB are separately deposited color by color (separate deposition). The light-emitting layers 25R, 25G, 25B are typically deposited by co-deposition using a host material and a dopant material. Materials selected from known materials can be used as the materials of the light-emitting layers 25R, 25G, 25B, such as the host material and the dopant material. The light-emitting layers 25R, 25G, 25B can be formed with a thickness in the range of, e.g., 10-100 nm. In the present embodiment, the new deposition method and a deposition apparatus for the new deposition method are used in this step, and will be described in detail later.

Then, the electron transport layer 26 is stacked on the light-emitting layers 25R, 25G, 25B (step S3). Specifically, the material of the electron transport layer 26 is deposited over the entire display region 11 by the same method as that used for the hole transport layer 24. Moreover, the electron injection layer 27 is stacked on the electron transport layer 26 (step S4). The electron injection layer 27 is also formed by the same method as that used for the hole transport layer 24, by depositing the material of the electron injection layer 27 over the entire display region 11.

Materials selected from known materials can be used as the materials of the electron transport layer 26 and the electron injection layer 27. Both the electron transport layer 26 and the electron injection layer 27 may be integrally formed by using the same material. Each of the electron transport layer 26 and the electron injection layer 27 may be formed with a thickness in the range of, e.g., 10-100 nm For example, the electron transport layer 26 may be formed with a thickness of 30 nm by using Alq, and the electron injection layer 27 may be formed with a thickness of 1 nm by using LiF.

Then, the second electrode 23 is stacked on the electron injection layer 27 (step S5). The second electrode 23 is also formed by the same method as that used for the hole transport layer 24, by depositing the material of the second electrode 23 over the entire display region 11. A material selected from known materials can be used as the material of the second electrode 23. For example, the second electrode 23 may be formed with a thickness of 50 nm by using aluminum (Al).

Lastly, the TFT substrate 10 having the organic EL element 20 thus formed thereon is bonded to the sealing plate 30 to hermetically seal the organic EL element 20. Thus, a main portion of the organic EL display 1 is completed.

(Separate Deposition)

The step of forming the light-emitting layers 25R, 25G, 25B by separate deposition (step S2) will be described below. Since the new deposition method described above and the deposition apparatus for the new deposition method are used in this step, the basic configuration thereof will first be described.

(Deposition Apparatus)

Figure 9:
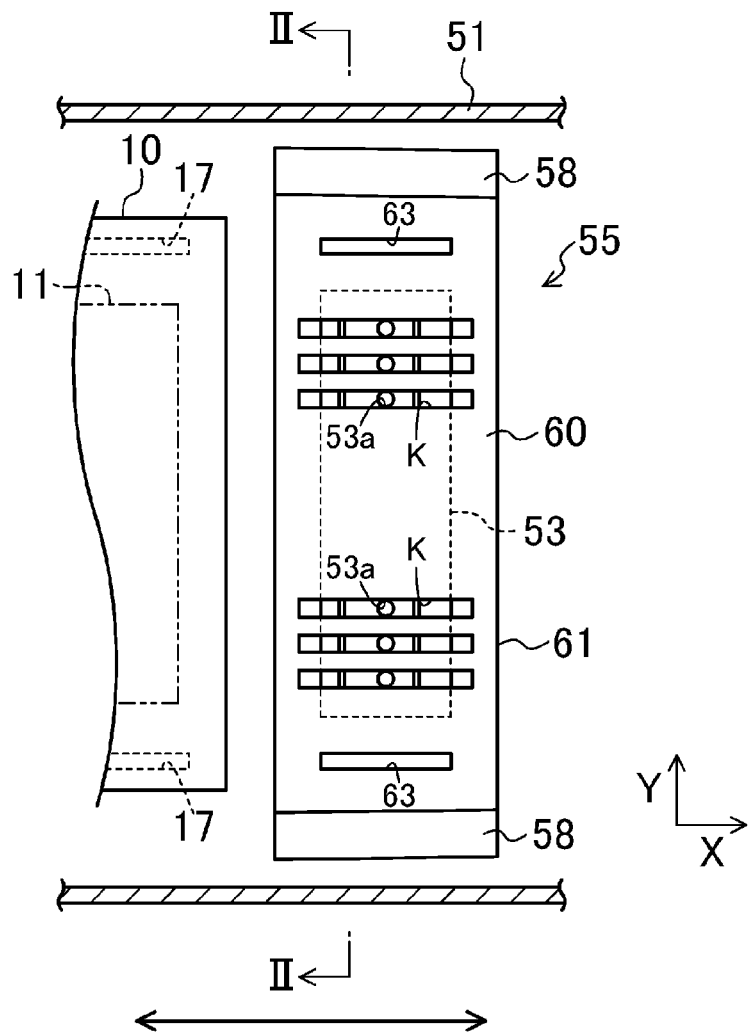
FIG. 9 is a schematic plan view showing a main part of a deposition apparatus.
Figure 10:
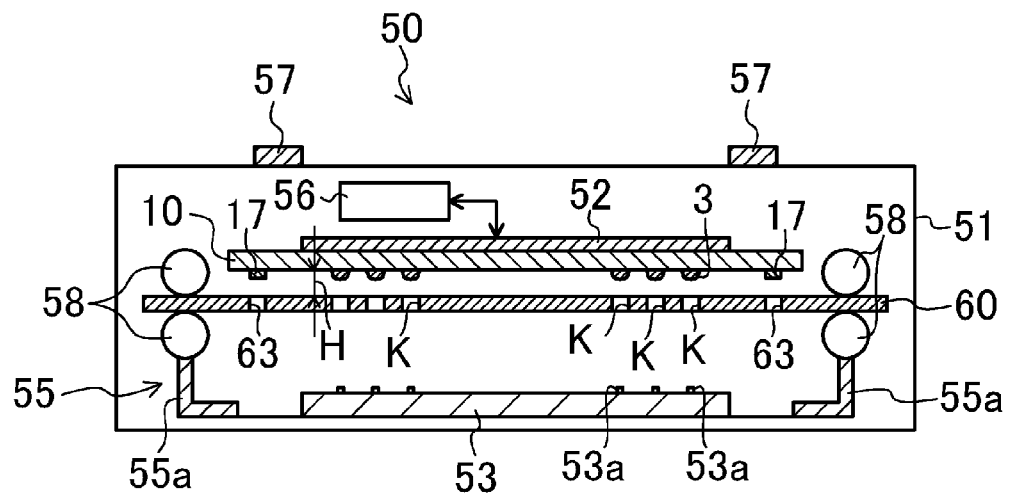
FIG. 10 is a schematic diagram showing a cross section taken along line II-II in FIG. 9.

FIGS. 9 and 10 show a deposition apparatus 50 of the present embodiment. As shown in these figures, the deposition apparatus 50 includes a vacuum chamber 51, a substrate support apparatus 52, a deposition source 53, a shadow mask 60 (a deposition mask), a mask unit 55, a moving apparatus 56, etc. The deposition apparatus 50 of the present embodiment is of a type in which deposition particles are emitted upward.

The vacuum chamber 51 is a box-shaped airtight container that can be opened and closed. The inside of the vacuum chamber 51 can be decompressed and held in a predetermined low pressure state by a decompression apparatus located outside the figure.

The substrate support apparatus 52 has a function to horizontally support the substrate 10 to be processed (also referred to as the "target substrate 10"), so that the row direction (the direction in which the sub-pixels 2R, 2G, 2B of each color are arranged in line) extends in the direction shown by arrow in FIG. 9 (the scanning direction). For example, if the substrate support apparatus 52 is provided with an electrostatic chuck, the target substrate 10 can be held by the electrostatic chuck, and thus can be supported without being bent by its own weight.

The substrate support apparatus 52 is capable of moving horizontally, and the horizontal movement of the substrate support apparatus 52 in the scanning direction is automatically controlled by the moving apparatus 56. For convenience, the scanning direction is also referred to as the "X-axis direction," and the direction perpendicular to the scanning direction is also referred to as the "Y-axis direction." The X-axis and Y-axis directions are shown as appropriate in the figures. The direction in which the deposition axis perpendicular to the target substrate 10 etc. extends (the vertical direction) is also referred to as the "Z-axis direction."

The shadow mask 60 is horizontally placed below the target substrate 10 supported by the substrate support apparatus 52, with a constant gap H between the shadow mask 60 and the target substrate 10. The vertical distance (the shortest distance) of the gap H is preferably in the range of 50 μm to 1 mm The smaller the vertical distance of the gap H is, the more preferable in order to prevent undesirable deposition. However, if the vertical distance of the gap H is less than 50 μm, the target substrate 10 may contact the shadow mask 60. If the vertical distance of the gap H exceeds 1 mm, deposition becomes unstable, which may cause color mixture or reduction in patterning accuracy.

The shadow mask 60 is in the shape of a rectangular plate, and has a plurality of openings K, K, ... formed in a stripe pattern so as to be arranged in line in the direction along the longer side of the shadow mask 60 and to extend along the shorter side of the shadow mask 60 (only some of the openings are shown in the figures). For example, the plurality of openings K, K, ... are formed so as to correspond to the rows of the sub-pixels 2R, 2G, 2B of each color of RGB. The dimension of the longer side of the shadow mask 60 is larger than the dimension in the Y-axis direction of the display region 11 of the target substrate 10 facing the shadow mask 60. The dimension of the shorter side of the shadow mask 60 is smaller than the dimension in the X-axis direction of the display region 11 of the target substrate 10 facing the shadow mask 60. The plurality of openings K, K, ... are provided in the range corresponding to the display region 11 in the Y-axis direction (an effective region).

A second marker 63 for alignment with a first marker 17 provided on the target substrate 10 is provided on both sides of the effective region. The first marker 17 and the second marker 63 are detected by a sensor 57 provided in the deposition apparatus 50, and the target substrate 10 and the shadow mask 60 are accurately positioned in the horizontal direction based on the detection value (these markers and the sensor are also referred to as the "positioning mechanism"). The shadow mask 60 is detachably mounted in the mask unit 55 so that the shorter side of the shadow mask 60 is parallel to the scanning direction. The shadow mask 60 will be described in detail later.

The mask unit 55 is provided with a holder 55a, a tension retaining apparatus 58, the deposition source 53, etc. The shadow mask 60 mounted in the mask unit 55 is horizontally supported by the tension retaining apparatus 58, and is held in a fixed relative positional relation with the deposition source 53 by the holder 55a.

The deposition source 53 is provided so as to extend along the Y-axis direction. The deposition source 53 is placed below the shadow mask 60 so as to face the target substrate 10 with the shadow mask 60 interposed therebetween. A plurality of emission ports 53a, 53a, . . . , through which the deposition particles are emitted toward the target substrate 10, are provided in the upper surface of the deposition source 53 so as to be arranged in line in the Y-axis direction (only some of the emission ports are shown in the figures). In the present embodiment, these emission ports 53a, 53a, . . . are arranged at the positions corresponding to the openings K of the shadow mask 60, respectively, and each emission port 53a is located in the center (the center in both X-axis and Y-axis directions) of a corresponding one of the openings K as viewed in plan. The deposition apparatus 50 is provided with a shutter (not shown) that opens and closes the space between the deposition source 53 and the shadow masks 60. By controlling opening and closing of the shutter, the deposition apparatus 50 is automatically controlled so that deposition can be performed at appropriate timing.

The deposition apparatus 50 may have various configurations other than the above configuration of the deposition apparatus 50. For example, the deposition apparatus 50 may be configured so that the mask unit 55 is moved, rather than being configured so that the substrate 10 is moved. The number of emission ports 53a and the arrangement thereof can be adjusted as appropriate. One or more emission ports 53a may be slit-shaped emission ports extending in the Y-axis direction. A plurality of emission ports 53a may be arranged in the X-axis direction.

Figure 11:
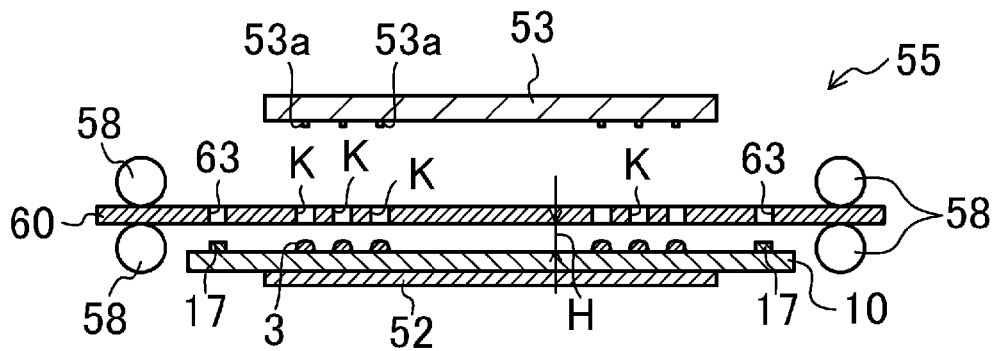
FIG. 11 is a schematic diagram showing a main part of a modification of the deposition apparatus.

As shown in FIG. 11, the positions of the mask unit 55 and the substrate support apparatus 52 may be reversed in the vertical direction so that the deposition particles are emitted downward. Since the configuration and function of each member etc. are similar to those of the deposition apparatus 50 of the present embodiment, the same reference characters are used, and description thereof is omitted. The mask unit 55 can be easily moved in this case. This configuration is also advantageous in that the target substrate 10 can be easily supported.

(Deposition Method)

Figure 12:
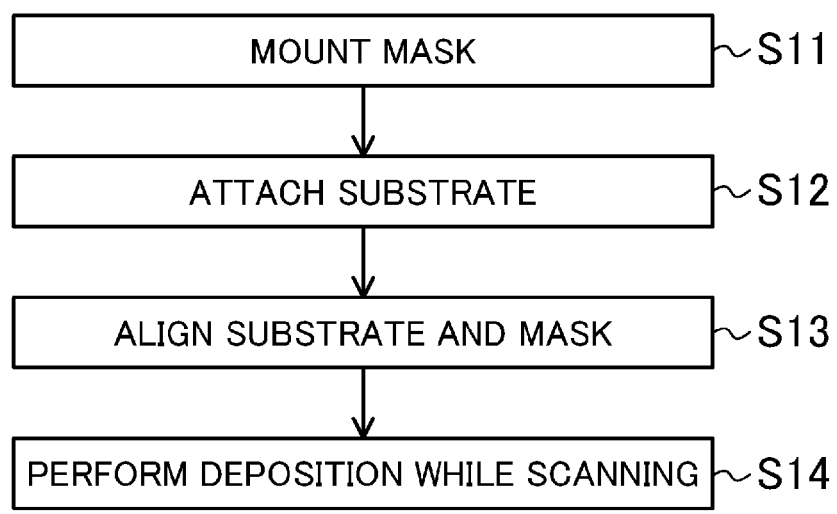
FIG. 12 is a flowchart showing a deposition process of a light-emitting layer.

FIG. 12 shows main steps of the deposition method. For example, the shadow mask 60 for the red (R) light-emitting layer 25R is mounted in the mask unit 55, and the shadow mask 60 is horizontally supported by the tension retaining apparatus 58 (step S11). At this time, the shadow mask 60 and the deposition source 53 are held in a fixed predetermined positional relation. A material for the red (R) light-emitting layer 25R has been placed in the deposition source 53. Next, the target substrate 10 is attached to and supported by the substrate support apparatus 52 so that the row direction of the target substrate 10 is parallel to the scanning direction (step S12). Then, the target substrate 10 and the shadow mask 60 are placed so as to face each other, and are aligned in the vertical direction (the Z-axis direction) so that the predetermined gap H is provided between the target substrate 10 and the shadow mask 60 (the alignment step, step S13).

After the target substrate 10 etc. is thus placed in the deposition apparatus 50, the deposition apparatus 50 is operated to perform deposition on the entire display region 11 of the target substrate 10 while scanning the target substrate 10 (the deposition step, step S14). In this deposition step, the target substrate 10 moves in the scanning direction at a constant scanning speed. The target substrate 10 has been accurately positioned in the horizontal direction with respect to the shadow mask 60 by the positioning mechanism. During the deposition step, the deposition particles are emitted from the deposition source 53, and are sequentially deposited on the target substrate 10 through the openings K of the shadow mask 60, whereby a thin film 3 is formed. The thickness of the thin film 3 can be controlled by, e.g., adjusting the scanning speed and the number of scanning times. After the deposition step, the thin film 3 (the red light-emitting layer 25R) having a stripe pattern is formed in the regions of the red (R) sub-pixels 2R, 2R, . . . on the target substrate 10.

After the red (R) light-emitting layer 25R is formed, the green (G) and blue (B) light-emitting layers 25G, 25B can be formed by the same deposition method by changing the shadow mask 60 and the materials of the deposition source 53. Since the sub-pixels 2R, 2G, 2B of each color of RGB are arranged at the same pitch, the same shadow mask 60 can be used for the light-emitting layers 25R, 25G, 25B of the three colors by, e.g., shifting (moving) the shadow mask 60 by a predetermined pitch in the Y-axis direction.

(Deposition Mask)

Figure 2:
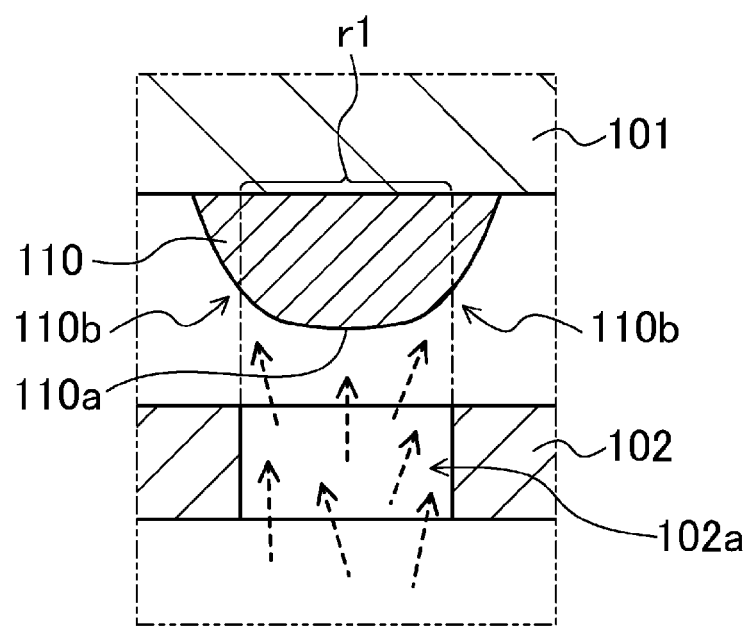
FIG. 2 is an enlarged schematic diagram of a portion shown by two-dot chain line in FIG. 1.
Figure 3:
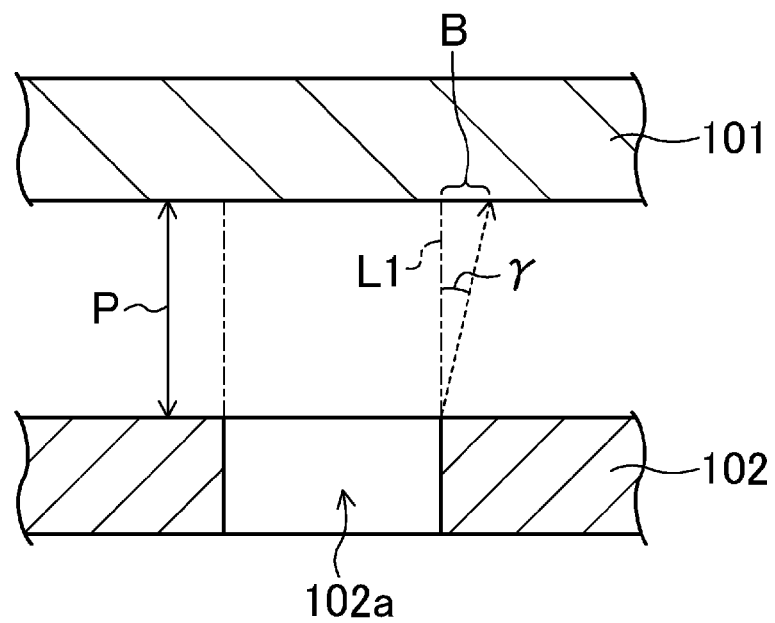
FIG. 3 is a diagram showing the relation between a gap between a deposition mask and a substrate and undesirable deposition.
Figure 4:
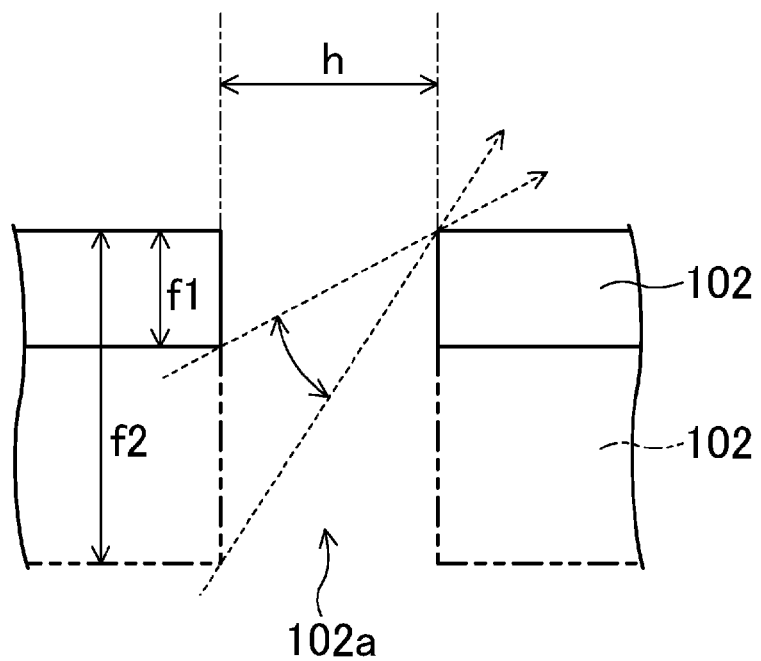
FIG. 4 is a diagram showing the relation between a cross-sectional aspect ratio of an opening and a passing angle.

As described above, in the new deposition method, an individual film of the thin film 3 having a stripe pattern, specifically a film extending in a band shape (linearly) (also referred to as the "element film"), tends to have a large amount of undesirable deposition at its lateral ends due to the gap H between the target substrate 10 and the shadow mask 60. That is, some of the deposition particles that obliquely pass through the opening K of the shadow mask 60 may be deposited on a portion outside the deposition region r1, thereby causing a large amount of undesirable deposition (see FIG. 2).

Thus, a new shadow mask 60 (also referred to as the "first improved mask 60A") was produced in order to reduce such undesirable deposition.

Figure 13:
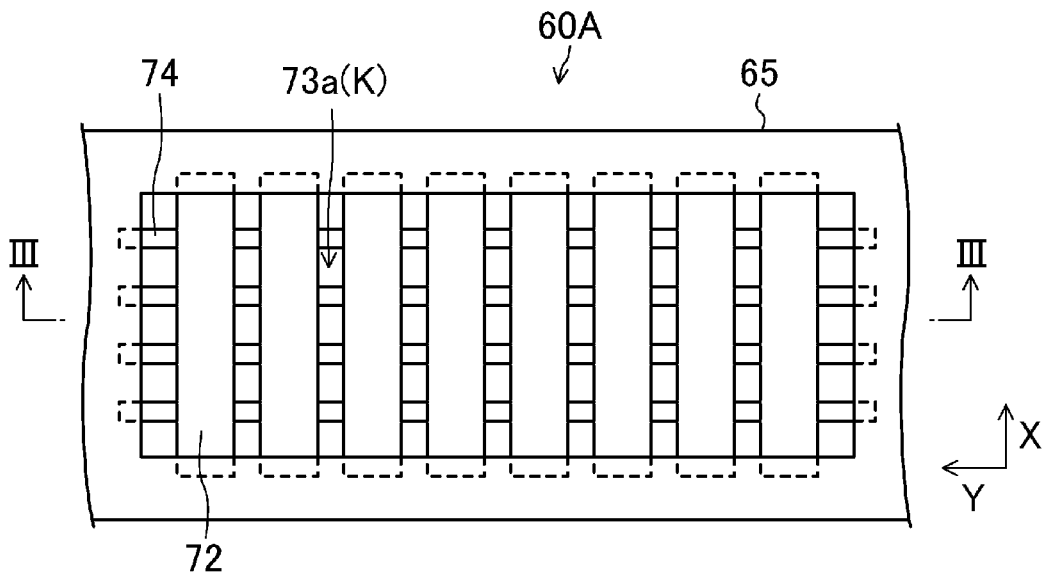
FIG. 13 is a schematic diagram showing a deposition mask in the first embodiment.
Figure 14:
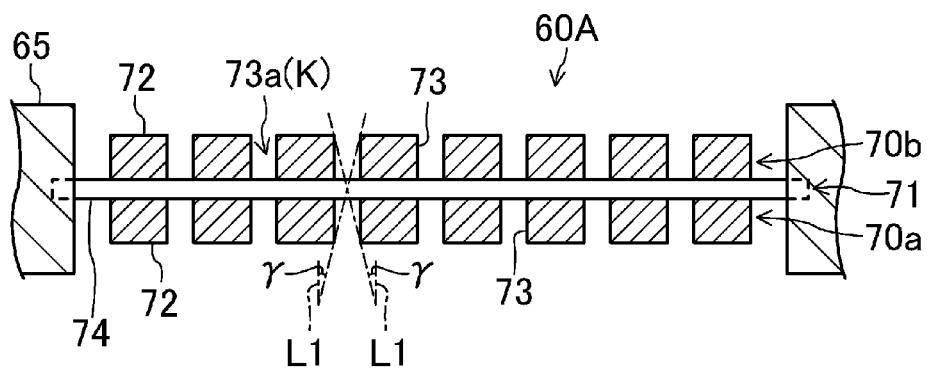
FIG. 14 is a schematic diagram showing a cross section taken along line III-III in FIG. 13.
Figure 15:
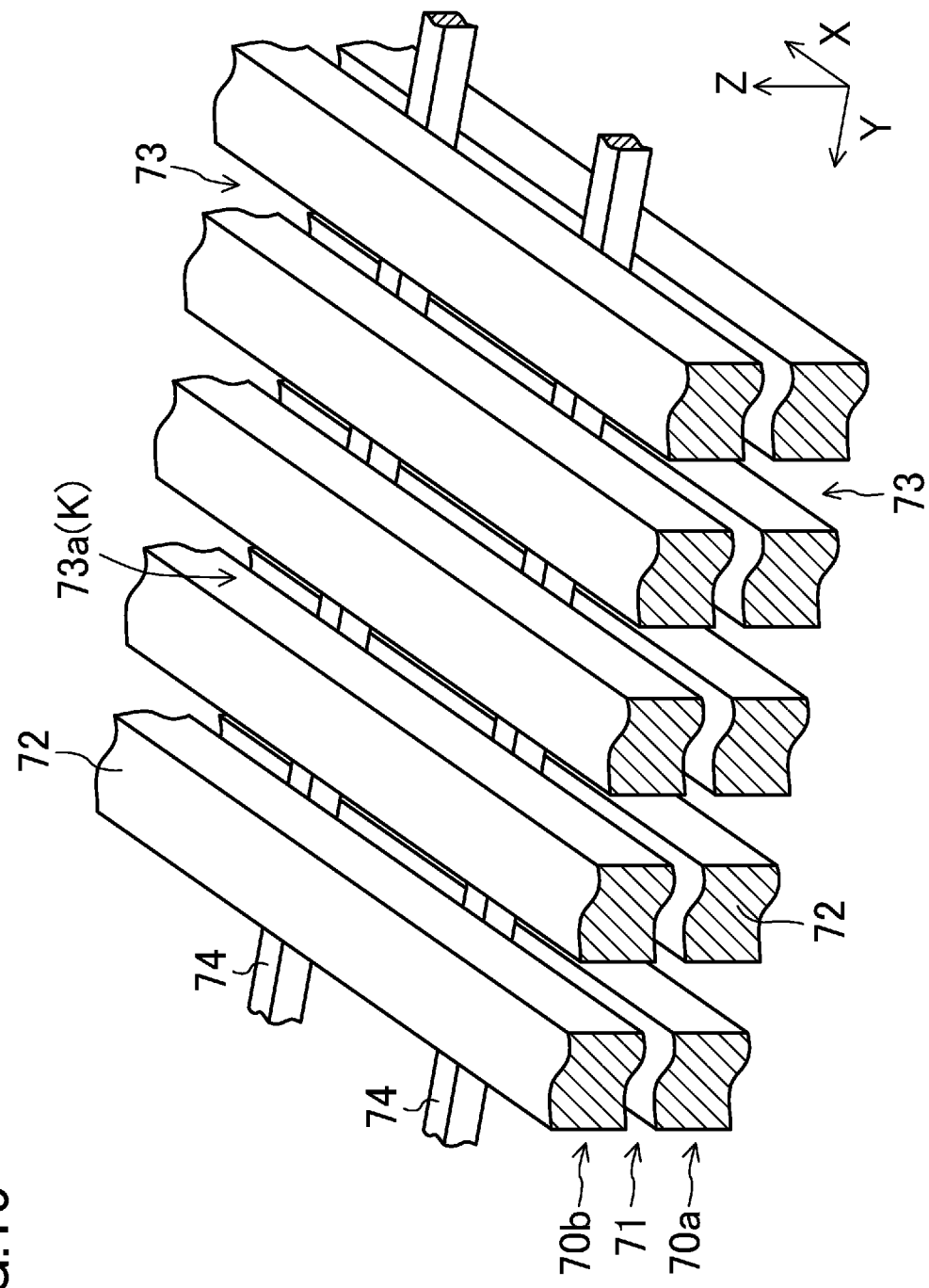
FIG. 15 is a schematic perspective view showing a main part of the deposition mask in the first embodiment.

FIGS. 13-15 show the improved mask 60A. The improved mask 60A has a rectangular frame 65 (a mask support body), and a plurality of mask layers 70, 70, . . . and a support layer 71 are provided inside the frame. In the present embodiment, the plurality of mask layers 70, 70, . . . are two mask layers 70, 70 overlapping each other in the vertical direction (these mask layers 70, 70 are also referred to as the "first mask layer 70a" and the "second mask layer 70b"), and one support layer 71 is interposed therebetween.

Each mask layer 70 is formed by arranging a plurality of mask wires 72 in a tensioned state in the frame 65. The plurality of mask wires 72 are placed at a predetermined pitch in a stripe pattern so as to extend parallel to the short side of the frame 65. Thus, each mask layer 70 has a plurality of slit-shaped gaps 73 defined by the plurality of mask wires 72 and extending parallel to each other. In the present embodiment, the plurality of gaps 73 have the same width dimension, and every adjoining two of the gaps 73 are separated from each other by a corresponding one of the mask wires 72 having the same width dimension. The mask wires 72 of the first mask layer 70a overlap the mask wires 72 of the second mask layer 70b in the vertical direction, so that the outlines of the mask wires 72 of the mask layer 70a match the outlines of the mask wires 72 of the mask layer 70b as viewed in the Z-axis direction.

The outlines of the plurality of gaps 73 of the mask layer 70a also match the outlines of the plurality of gaps 73 of the mask layer 70b in the vertical direction, so that the plurality of gaps 73 linearly extend through both mask layers 70 as viewed in the Z-axis direction (through gaps 73a). A plurality of openings K that allow the deposition particles to pass therethrough are formed by the through gaps 73a. That is, of the deposition particles that enter the through gaps 73a (the openings K), only the deposition particles having a passing angle smaller than the passing angle γ can be emitted from the through gaps 73a (the openings K).

The support layer 71 is formed by arranging a plurality of support wires 74 in a tensioned state in the frame 65. The plurality of support wires 74 are placed to cross the mask wires 72. For example, the plurality of support wires 74 are placed substantially parallel to the long side of the frame 65. The support layer 71 is provided in order to support the upper and lower mask layers 70 to hold them at predetermined positions. Thus, unlike the mask layers 70 forming the openings K, the support layer 71 need not necessarily be placed with high accuracy. The direction in which the support wires 74 are arranged in a tensioned state in the frame 65 may be oblique or may be varied among the support wires 74. The pitch of the support wires 74 may be relatively large, and the support wires 74 need not necessarily be arranged at a fixed pitch.

The mask wires 72 and the support wires 74 may be comprised of a metal material such as a stainless steel, nickel, or an alloy, a synthetic resin material, etc. For example, metal wires having a rectangular cross section are used as the mask wires 72 and the support wires 74 shown in the present embodiment. Each of these wires is tensioned, and in this state, both ends of each wire are fixed to the frame 65 by fusion, bonding, etc. Since it is more preferable to fix the contact points between the mask wire 72 and the support wire 74, the mask wire 72 and the support wire 74 may be connected together at these contact points by fusion, bonding, etc.

In order for the through gaps 73a to properly function as the openings K, the mask wires 72 and the support wires 74 of the first improved mask 60A are placed so that of the deposition particles that enter the gaps 73 in the mask layer 70 located on the side of the deposition source 53, the deposition particles other than those emitted through the gaps 73 in the mask layer 70 located on the side of the substrate 10 are caught by either the mask layer 70 or the support layer 71.

Figure 16:
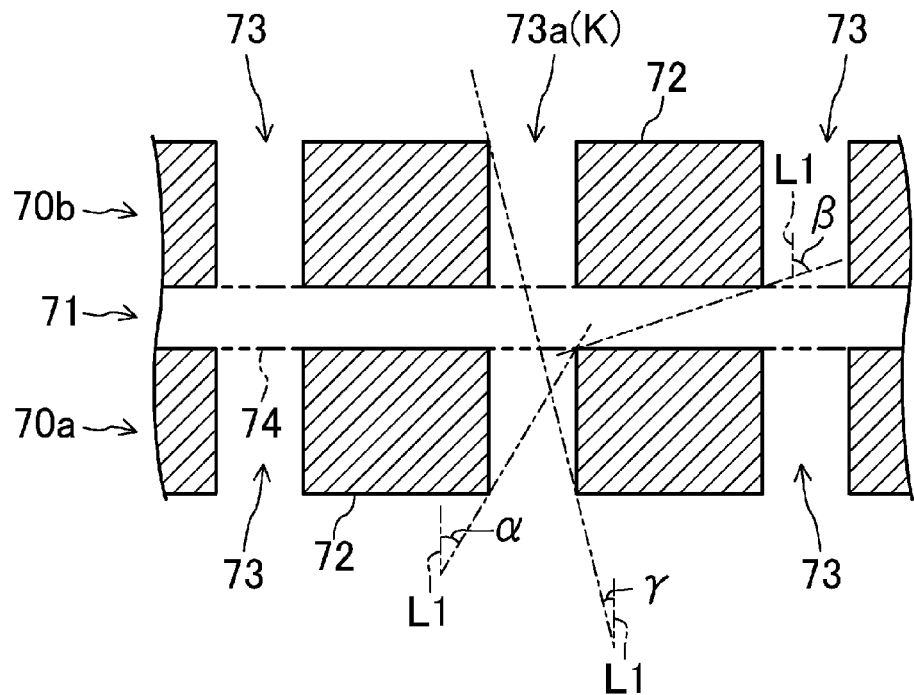
FIG. 16 is a schematic enlarged view of a main part in FIG. 14.

This will be described in detail with reference to FIG. 16. FIG. 16 is a diagram showing a part of the first improved mask 60 as viewed in the X-axis direction, where the lower side of the figure represents the first mask layer 70a located on the side of the deposition source 53, and the upper side of the figure represents the second mask layer 70b located on the side of the target substrate 10.

As shown in FIG. 16, "α" represents the maximum passing angle at which the deposition particles pass through the gaps 73 in the first mask layer 70a with respect to the deposition axis L1. Similarly, "β" represents the minimum passing angle at which the deposition particles pass through the space between a portion between two adjoining gaps 73, 73 in the first mask layer 70a and a portion between two adjoining gaps 73, 73 in the second mask layer 70b, which overlaps the portion between the two adjoining gaps 73, 73 in the first mask layer 70a in the vertical direction. The dimensions of the first improved mask 60A are designed so that the passing angle β is larger than the passing angle α.

With the dimensions being designed in this manner, of the deposition particles that enter the gaps 73 in the first mask layer 70a, the deposition particles that enter the space between the first mask layer 70a and the second mask layer 70b hit the support layer 71 (the support wires 74) or the second mask layer 70b (the mask wires 72) and are caught by the support layer 71 (the support wires 74) or the second mask layer 70b (the mask wires 72). Thus, these deposition particles do not pass through the first improved mask 60A.

Accordingly, in this case, the deposition particles that can be emitted through the gaps 73 in the second mask layer 70b are defined by the gaps 73 in the first mask layer 70a and the gaps 73 in the second mask layer 70b which linearly connect with the gaps 73 in the first mask layer 70a, respectively (the through gaps 73a). The deposition particles that can be emitted through the gaps 73 in the second mask layer 70b are thus limited to the deposition particles having a passing angle smaller than the maximum passing angle γ at which the deposition particles pass through the through gaps 73a.

That is, the first improved mask 60A has substantially the same advantage as that obtained when the openings K are formed by forming holes having the same width as that of the gaps 73 in a metal plate having the same thickness as the total thickness of the first mask layer 70a, the second mask layer 70b, and the support layer 71. Thus, a high cross-sectional aspect ratio can be easily implemented in the first improved mask 60A.

Moreover, a deposition mask having a different cross-sectional aspect ratio and a different pitch can be obtained by merely adjusting the size of the gaps 73 and the sizes of the mask wires 72 and the support wires 73. Thus, a fine thin film can be patterned as desired. Furthermore, since the first improved mask 60A has a hollow space between the mask layers 70 (the support layer 71), the weight of the deposition mask can be reduced as compared to the conventional deposition masks in which the openings K are formed by forming holes in a metal plate.

Moreover, although a large metal plate is required in order to increase the size of the conventional deposition masks, the size of the first improved mask 60A can be relatively easily increased by merely changing the lengths of the mask wires 72 and the support wires 74 and attaching the mask wires 72 and the support wires 74 to the frame 65. Since the mask wires 72 are supported by the plurality of support wires 74 crossing the mask wires 72, displacement can be effectively suppressed even if the size of the deposition mask is increased.

Figure 17:
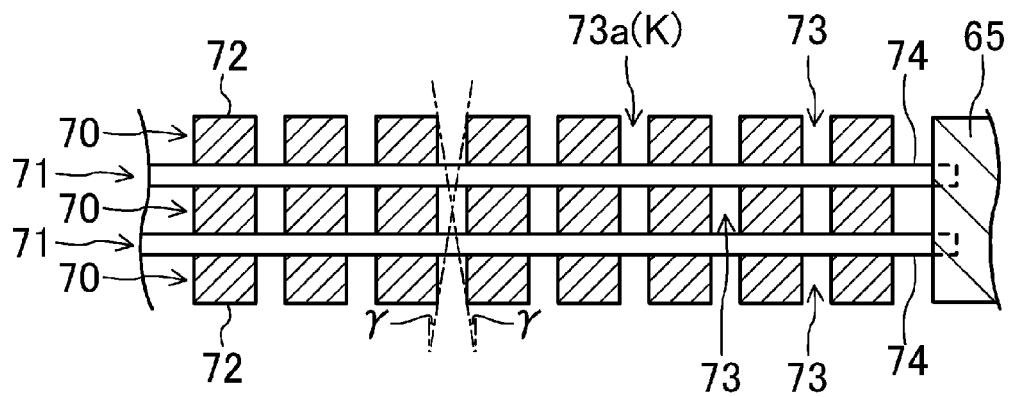
FIG. 17 is a schematic cross-sectional view showing a deposition mask (a modification) in the first embodiment.

The first improved mask 60A is not limited to the form described above, and may be implemented in various forms. For example, as shown in FIG. 17, the first improved mask 60A may have three or more mask layers 70. In this case, the support layer 71 is provided between every adjoining two of the mask layers 70. The plurality of mask wires 72 and the plurality of support wires 74 are placed so that of the deposition particles that enter the gaps 73 in the outermost mask layer 70 located on the side of the deposition source 53, the deposition particles other than those emitted through the gaps 73 in the outermost mask layer 70 located on the side of the substrate 10 are caught by either the mask layer 70 or the support layer 71.

Figure 18:
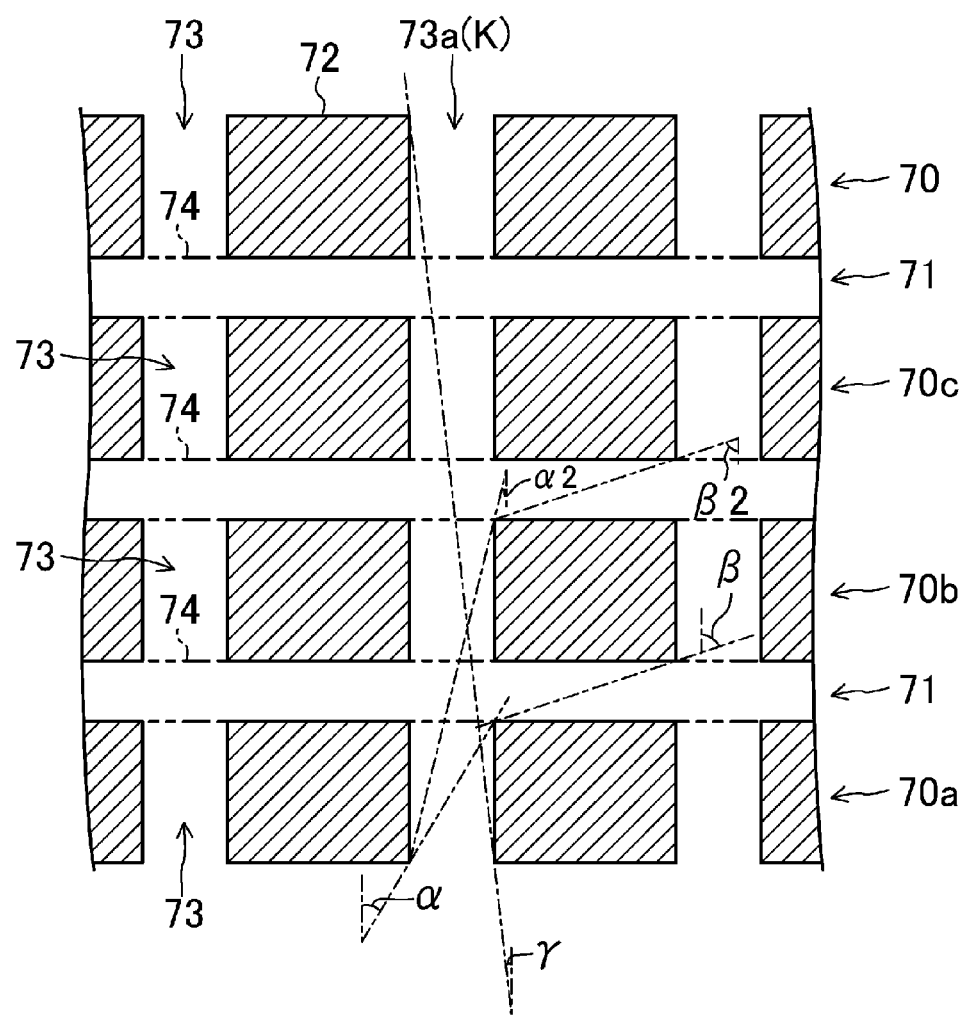
FIG. 18 is a schematic enlarged cross-sectional view showing a main part of a deposition mask (a modification) in the first embodiment.

As shown in FIG. 18, for example, "αn" ("α2" in the figure) represents the maximum passing angle at which the deposition particles pass through the through gaps 73a from the first mask layer 70a to the $N^{th}$ ("second" in the figure) mask layer 70 (the second mask layer 70b in the figure) with respect to the deposition axis L1. "βn" ("β2" in the figure) represents the minimum passing angle at which the deposition particles pass through the space between a portion between two adjoining gaps 73, 73 in the N$^{th}$ mask layer 70 and a portion between two adjoining gaps 73, 73 in the (N+1)$^{th}$ (third in the figure) mask layer 70 (the third mask layer 70c in the figure), which overlaps the portion between the two adjoining gaps 73, 73 in the N$^{th}$ mask layer 70. The dimensions of the improved mask are designed so that the passing angle βn is larger than the passing angle αn (where "N" and "n" are integers of 1 or more).

This allows only the deposition particles having a passing angle smaller than the passing angle γ in the through gaps 73a each formed by those gaps 73 of the plurality of mask layers 70 which overlap each other to pass through the improved mask. Since the through gaps 73a each formed by the plurality of gaps 73 linearly connecting each other substantially function as the openings K, the cross-sectional aspect ratio can further be increased, and undesirable deposition can be reduced.

Figure 19:
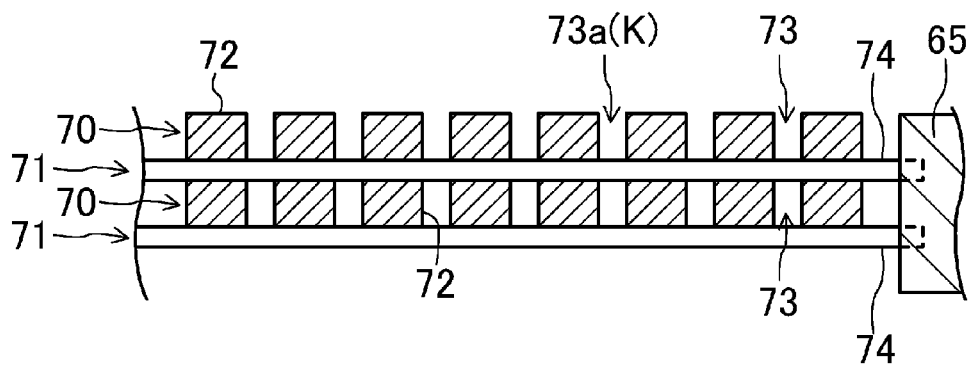
FIG. 19 is a schematic cross-sectional view showing a deposition mask (a modification) in the first embodiment.

As shown in FIG. 19, the support layer 71 may be provided not only between the mask layers 70 but also outside the mask layer 70. Providing the support layer 71 outside the mask layer 70 allows the mask layers 70 to be supported more firmly, and can suppress displacement etc.

Figure 20A:
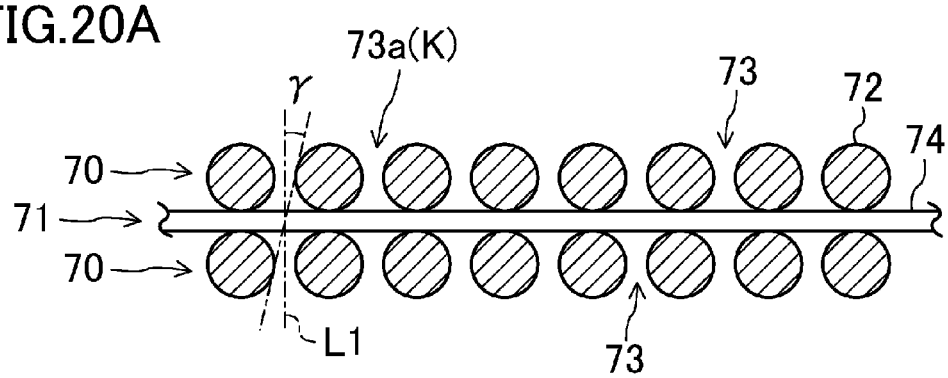
FIGS. 20A-20B are schematic cross-sectional views each showing a deposition mask (a modification) in the first embodiment.
Figure 20B:
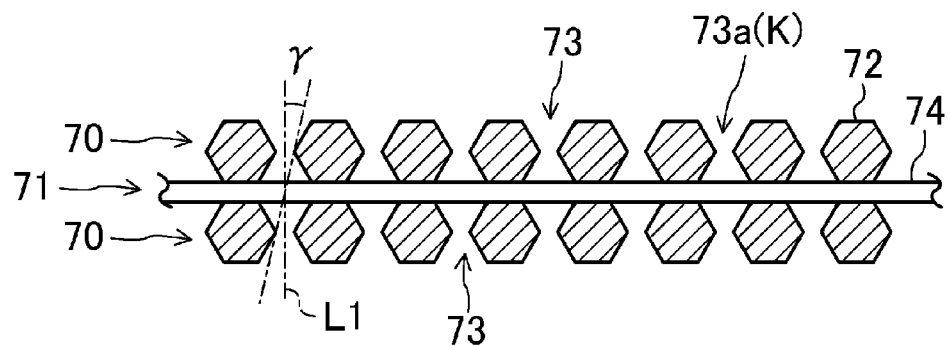

As shown in FIGS. 20A-20B, the mask wires 71 and the support wires 74 may have various cross-sectional shapes. For example, the cross section (outline) may have a circular shape as shown in FIG. 20A, and may have a polygonal shape such as a hexagon as shown in FIG. 20B. Different cross-sectional shapes may be combined.

The circular cross section is advantageous in that general-purpose products can be used and the material cost can be suppressed. The polygonal cross section is effective in preventing displacement because the contact area between the mask wire 72 and the support wire 74 is increased. In particular, a rectangular cross section is preferable because the through gaps 83a (the openings K) can be formed parallel to the Z-axis direction.

(Positional Relation between Deposition Mask and Pixel)

It is preferable that the openings K (the through gaps 73a) of the first improved mask 60A have a predetermined positional relation with the sub-pixels 2R, 2G, 2B of the target substrate 10.

Figure 21:
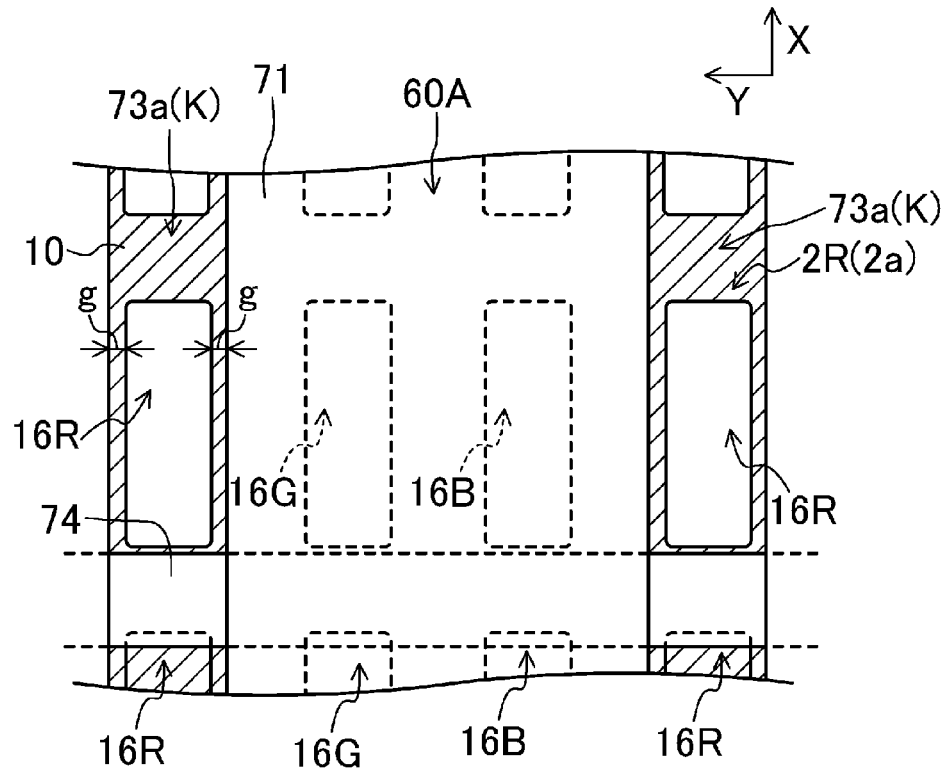
FIG. 21 is a schematic plan view showing the positional relation between the deposition mask and a pixel in the first embodiment.

FIG. 21 shows a state (a state in the deposition process) where, e.g., the target substrate 10 is accurately positioned in the horizontal direction with respect to the first improved mask 60A by the positioning mechanism. In FIG. 21, the target substrate 10 is viewed in the Z-axis direction from the side of the deposition source 53. For better understanding, the substrate 10 other than the light-emitting regions 16R, 16G, 16B is shaded in the figure. In this case, the openings K are placed so as to face the sub-pixels 2R, 2G, 2B (pixels 2a to be formed, hereinafter referred to as the "film formation pixels 2a") in which the thin film 3 (the element films) are formed. For example, in the Y-axis direction, two rows of the green (G) and blue (B) sub-pixels 2G, 2B are present between two adjacent rows of the red (R) sub-pixels 2R, 2R. Accordingly, when forming the red (R) light-emitting layer 25R, the openings K are provided only in the portions facing the rows of the red (R) sub-pixels 2R.

As shown in FIG. 21, the first improved mask 60A is positioned so that each of the light-emitting regions 16R, 16G, 16B of the film formation pixels 2a is located inside the opening K with a gap "g" therebetween.

Specifically, the predetermined amount of gap "g" (a design margin) is provided between the inner edge of the opening K, which extends in the X-axis direction, and the outer edge of the light-emitting region, which extends in the X-axis direction. Providing the design margin can suppress defective formation of the thin film 3 (the element films) due to a difference in dimensions between the first improved mask 60A and the target substrate 10 and misalignment therebetween, whereby productivity in a mass production process can be improved.

(First Example)

The light-emitting layers 25R, 25G, 25B were formed by using the first improved mask 60A, the deposition apparatus 50, and the new deposition method described above. A mask having a size of 200 mm (the X-axis direction)×600 mm (the Y-axis direction) was used as the first improved mask 60A.

Wires comprised of an invar material (a Ni—Fe alloy containing 36% of Ni) and having a 340 μm×340 μm square cross section were used as the mask wires 72 and the support wires 74. Thus, the total thickness of the first improved mask 60A was 1,020 μm. The gap H between the target substrate 10 and the first improved mask 50A was 300 μm.

Each opening K had a width (the Y-axis direction) of 110 μm, and had a length (the X-axis direction) of 150 mm The pitch of the openings K in the Y-axis direction was 450 μm. The number of openings K was 751. A shield plate comprised of an invar material and having a thickness of 100 μm was placed on the outer periphery of the region where the openings K were provided, so that the region where the openings K were provided was limited to a predetermined size. The pitch of the support wires 74 was 1 cm. In this example, the passing angle α was 17.9°, and the passing angle β was 45°. Thus, the predetermined conditions were satisfied (see FIG. 16).

Each light-emitting region 16R, 16G, 16B of the film formation pixels 2a had a size of 300 μm (the X-axis direction)× 90 μm (the Y-axis direction), and the pitch of the light-emitting regions 16R, 16G, 16B was 450 μm in the X-axis direction and 150 μm in the Y-axis direction.

In this case, the maximum incident angle γ of the deposition particles was 6.2°, and the cross-sectional aspect ratio was about 9.3.

A host material and a dopant material were used as the materials of the light-emitting layers 25R, 25G, 25B of each color, and the deposition speeds of these materials were 5.0 nm/s and 0.53 nm/s for red (R), 5.0 nm/s and 0.67 nm/s for green (G), and 5.0 nm/s and 0.67 nm/s for blue (B). Scanning with one reciprocating motion was performed once in the deposition process.

As a result, the RGB light-emitting layers 25R, 25G, 25B having a very uniform thickness were able to be formed. At this time, the undesirable deposition width was about 33 μm.

The weight of the first improved mask 60A other than the frame 65 was about 205 g. The weight of a deposition mask comprised of the same material and having the same size is about 890 g if it is fabricated by a conventional method using a metal plate. Thus, the weight of the deposition mask was able to be significantly reduced in the first improved mask 60A.

[Second Embodiment]

In the shadow mask 60 of the first embodiment, the gaps 73 in each mask layer 70 are separated from each other by a single mask wire 72. The present embodiment is different from the first embodiment particularly in that the gaps 73 in each mask layer 70 are separated from each other by a plurality of (in the present embodiment, three) mask wires 72 (also referred to as the "element mask wires 72a"). Since the deposition apparatus 50, the deposition method, etc. are similar to those of the first embodiment, only differences will be described in detail. Similar configurations and members are denoted with the same reference characters, and description thereof will be omitted.

Figure 22:
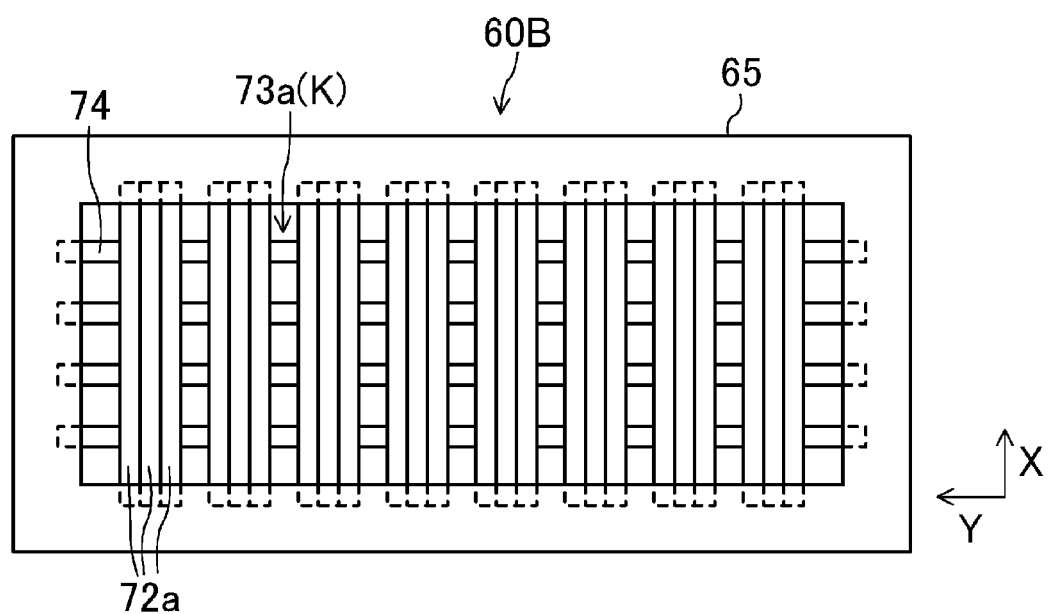
FIG. 22 is a schematic diagram showing a deposition mask in a second embodiment.
Figure 23:
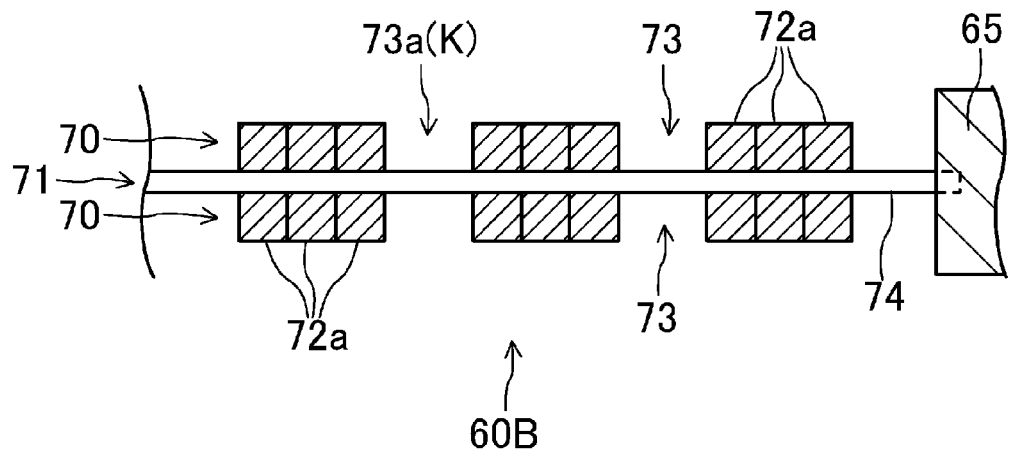
FIG. 23 is a schematic cross-sectional view of the deposition mask in the second embodiment.

FIGS. 22-23 show a shadow mask 60 (a second improved mask 60B) of the present embodiment. As shown in these figures, in the second improved mask 60B, a plurality of gaps 73 (through gaps 73a) are separated from each other by three element mask wires 72a.

Thus, even if the width and pitch of the openings are changed in the second improved mask 60B, the number of element mask wires 72a can be changed accordingly, which eliminates the need to prepare mask wires 72 having different dimensions. This can reduce the number of materials, and thus can reduce manufacturing cost.

As shown in FIG. 22 etc., in the case where the width of the region between adjoining two gaps 73 is an integral multiple of the width dimension of the element mask wire 72a, the plurality of element mask wires 72a can be arranged in close contact with each other. In other cases, however, a gap 73 may be formed between the element mask wires 72a, and the deposition particles may be unexpectedly deposited through the gap 73.

Figure 24:
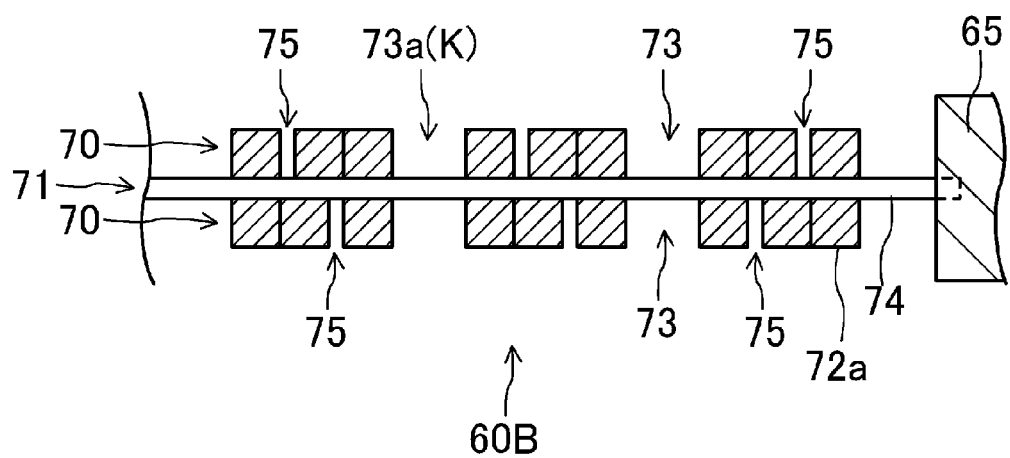
FIG. 24 is a schematic cross-sectional view showing a deposition mask (a modification) in the second embodiment.

As shown in FIG. 24, in such cases, an appropriate gap 73 (an adjusting gap 75) is formed between, e.g., the element mask wires 72a. This allows only the through gaps 73a to function as the openings K even if the width of the region between adjoining two gaps 73 is not an integral multiple of the width dimension of the element mask wire 72a.

Specifically, the plurality of element mask wires 72a may be arranged so that all the deposition particles entering the adjusting gaps 75 are caught by either the mask layer 70 or the support layer 71. In order to implement this, the adjusting gaps 75 in the mask layers 70 may be displaced from each other as viewed in the X-axis direction, so as to block the passage of the deposition particles.

Figure 25:
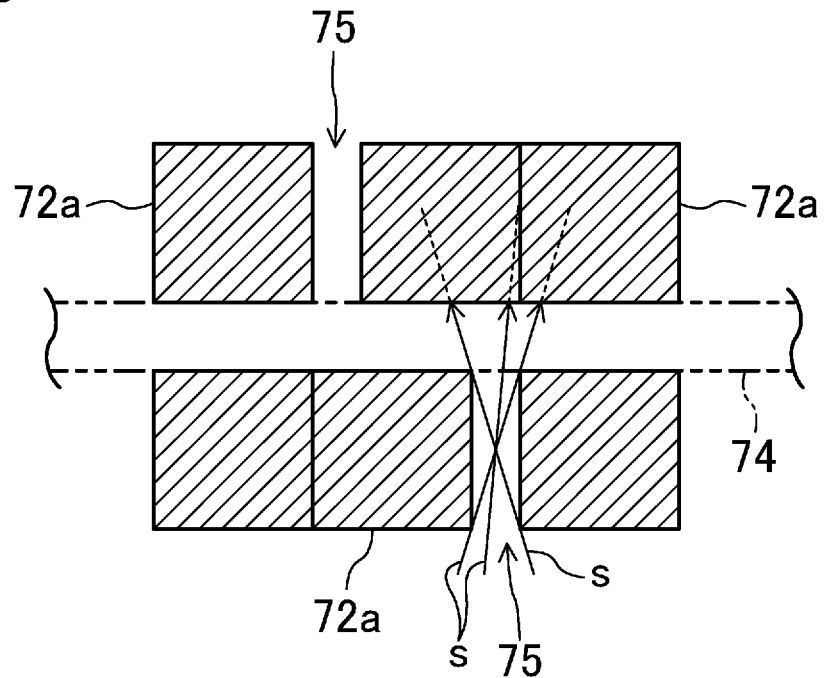
FIG. 25 is an enlarged schematic diagram of a main part in FIG. 24.

Specifically, as shown in FIG. 25, imaginary lines s along which the deposition particles can pass through the adjusting gap 75 formed in the mask layer 70 on the side of the deposition source 53 are defined based on the directionality of the deposition particles. In this case, the element mask wires 72a are placed so that each of the imaginary lines s crosses any element mask wire 72a of any mask layer 70, and no deposition particles pass through any gap 73 or any adjusting gap 75 formed in the outermost mask layer 70 on the side of the substrate 10.

This configuration also allows only the predetermined through gaps 73a to function as the openings K, and can increase the cross-sectional aspect ratio of the openings K. Moreover, forming the adjusting gaps 75 in the mask layers 70 facilitates formation of hollow spaces, and can further reduce the weight of the deposition mask.

As in the above embodiment, the number of mask layers 70 may be three or more, and the element mask wires 72a may have various cross sectional shapes.

Figure 26:
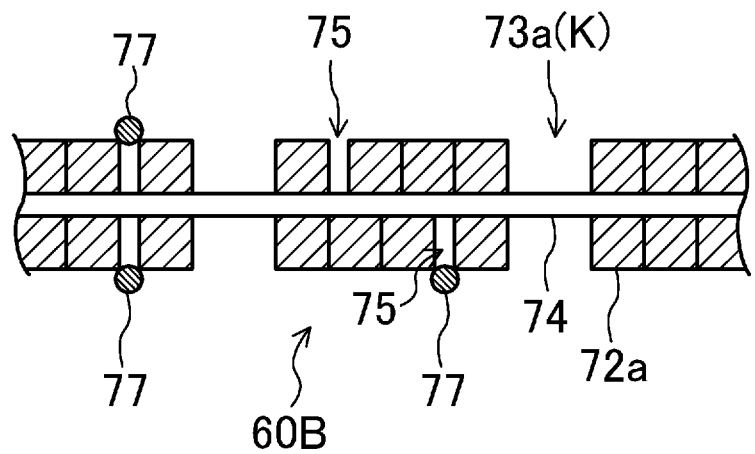
FIG. 26 is a schematic cross-sectional view showing a deposition mask (a modification) in the second embodiment.

As shown in FIG. 26, in the present embodiment, the adjusting gaps 75 may be sealed by a sealing member 77. For example, wires having a diameter larger than the width of the adjusting gap 75 (these wires are also referred to as the "sealing wires 77") may be provided in the frame 65 in a tensioned state, and the adjusting gaps 75 may be blocked by the sealing wires 77. Although it is preferable to block all the adjusting gaps 75 located on both sides, it is also possible to block all the adjusting gaps 75 located on one side. At least the adjusting gaps 75 through which the deposition particles may pass should be blocked.

In this case, wires having a circular cross section are preferably used as the sealing wires 77. The wires having a circular cross section can be easily caught by the adjusting gaps 73, whereby positioning is facilitated. Other methods include placing a resin etc. in the adjusting gaps 75.

(Second Example)

In this example, as shown in FIG. 22 etc., a second improved mask 60B was formed by separating the gaps 73 in each mask layer 70 from each other by the three element mask wires 72a, and stacking four mask layers 70 on each other. Wires comprised of an invar material and having a 100 µm×100 µm square cross section were used as the mask wires 72. Wires comprised of an invar material and having a 200 µm×200 µm square cross section were used as the support wires 74. The width, pitch, etc. of the openings K were the same as those of the first embodiment.

In this case, since the width of the region between adjoining two gaps 73 is 340 µm, the adjusting gaps 75 having a width of 40 µm are required. Thus, the adjusting gaps 75 formed in the mask layers 70 are arranged to be displaced from each other as shown in FIG. 24, so that no deposition particles pass therethrough. The light-emitting layers 25R, 25G, 25B were formed by using the same setting of the deposition apparatus and the same conditions of the deposition process as those of the first example.

As a result, the RGB light-emitting layers 25R, 25G, 25B of each color having a uniform thickness were able to be formed. The undesirable deposition width was about 33 µm as in the first example.

[Third Embodiment]

In the shadow mask 60 of the first embodiment, the support wires 74 are placed so as to be interposed between vertically adjoining ones of the mask layers 70. The present embodiment is different from the first embodiment particularly in that the plurality of support wires 74 are arranged in a staggered manner with respect to the plurality of mask wires 72. Since the deposition apparatus 50, the deposition method, etc. are similar to those of the first embodiment, only differences will be described in detail. Similar configurations and members are denoted with the same reference characters, and description thereof will be omitted.

Figure 27:
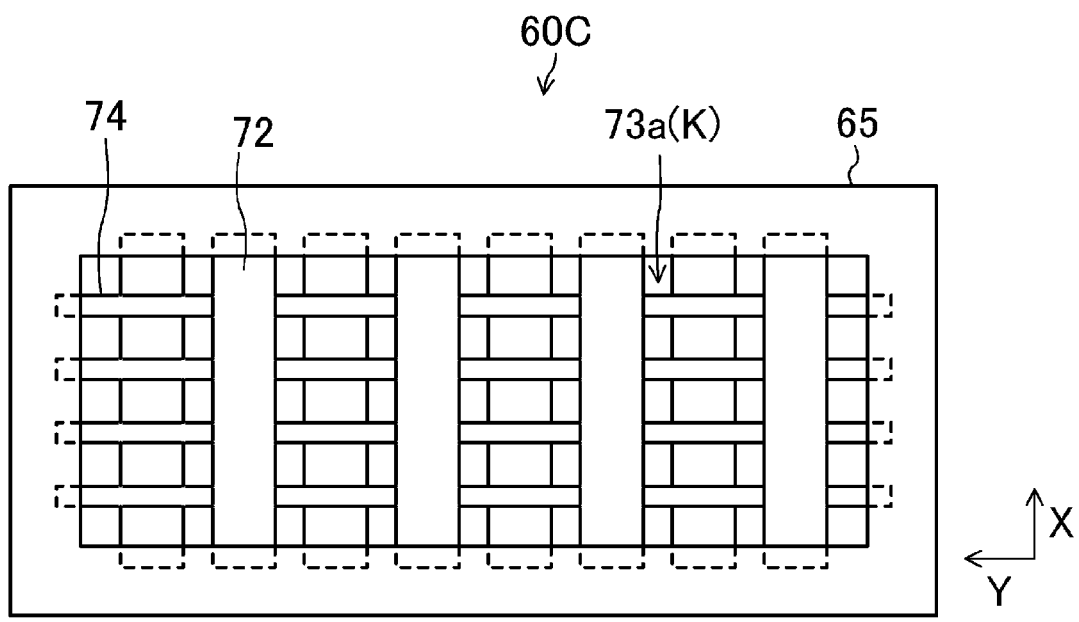
FIG. 27 is a schematic diagram showing a deposition mask in a third embodiment.
Figure 28:
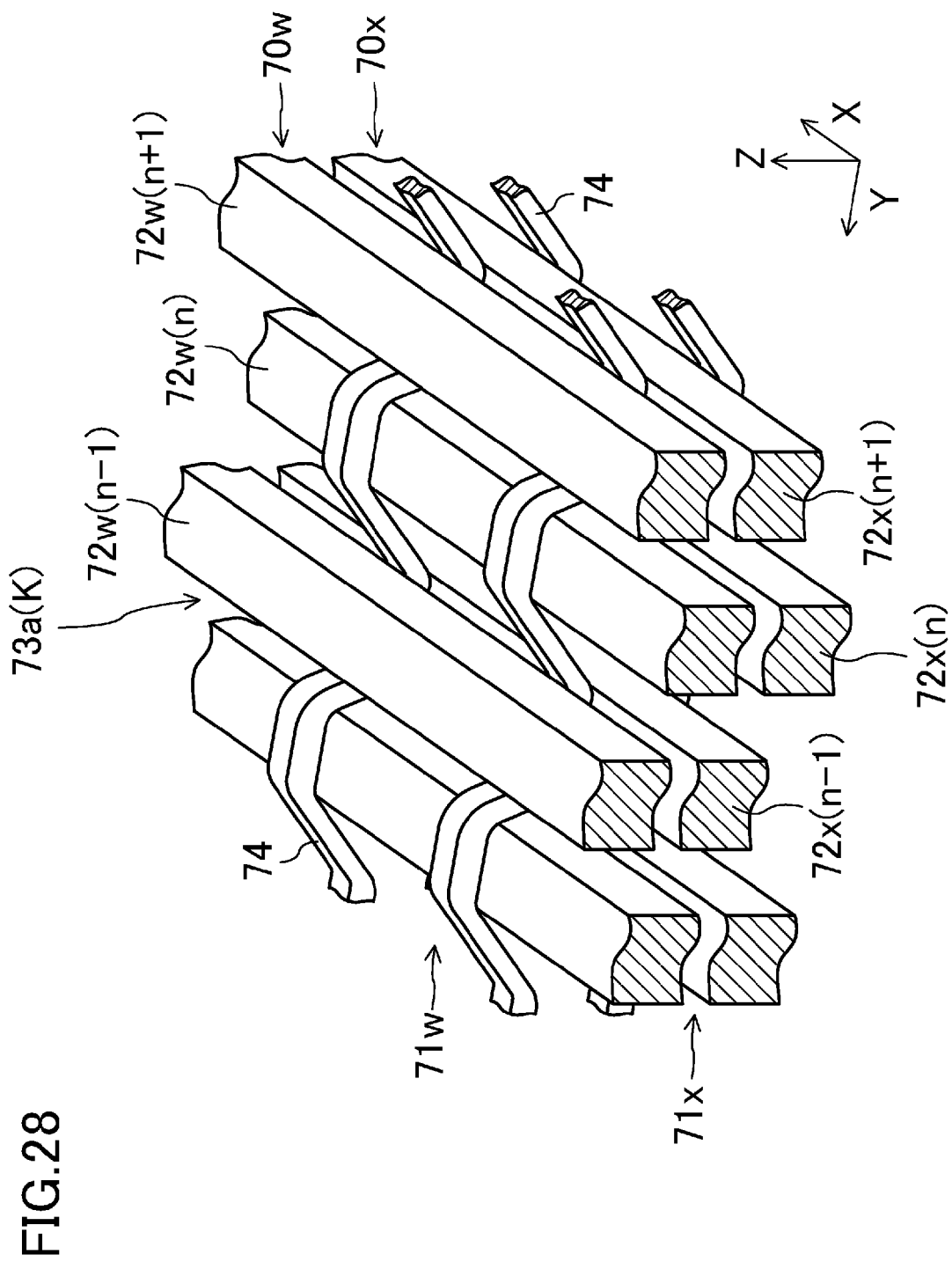
FIG. 28 is a schematic perspective view showing a main part of the deposition mask in the third embodiment.
Figure 29:
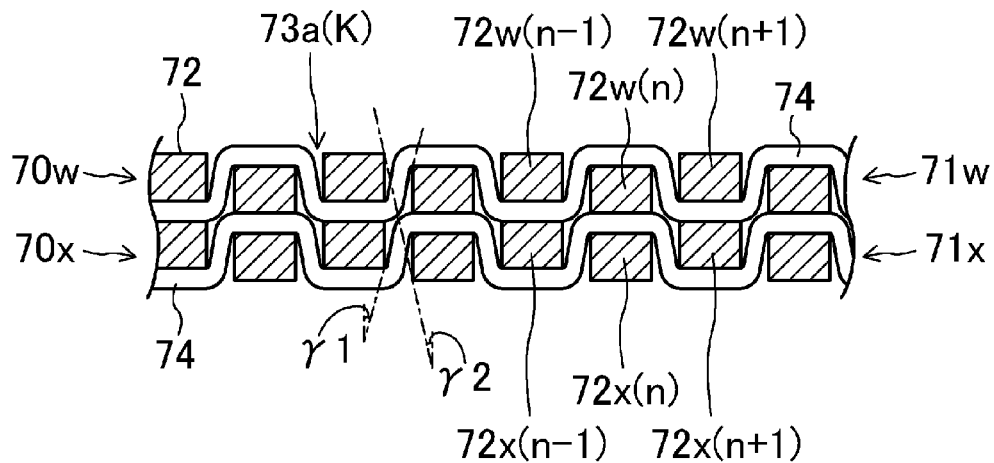
FIG. 29 is a schematic cross-sectional view showing a main part in FIG. 27.

FIGS. 27-29 show a shadow mask 60 (a third improved mask 60C) of the present embodiment. As shown in these figures, in the third improved mask 60C, each support wire 74 is placed so as to alternately extend above and below the mask wires 72 of the same mask layer 70. The third improved mask 60C is formed by two mask layers 70 and two support layers 71 (for convenience, in these figures, the upper mask layer 70 and the upper support layer 71 are also referred to as the "first mask layer 70w" and the "first support layer 71w," and the lower mask layer 70 and the lower support layer 71 are also referred to as the "second mask layer 70x" and the "second support layer 71x"). In the third improved mask 60C as well, the number of mask layers 70 and the number of support layers 71 are not limited to two, and there may be three or more mask layers 70 and three or more support layers 71.

Specifically, each support wire 74 of each support layer 71 is placed so as to alternately extend above and below the mask wires 72 of each mask layer 70 in the same order in the Y-axis direction. For example, if each support wire 74 of the first support layer 71w is located above the $n^{th}$ mask wire 72w(n) from one end of the first mask layer 70w in the Y-axis direction, each support wire 74 of the first support layer 71w is located below the $(n-1)^{th}$ mask wire 72w(n-1) and the $(n+1)^{th}$ mask wire 72w(n+1) that adjoin the mask wire 72w(n) in the first mask layer 70w.

The same applies to the second mask layer 70x and the second support layer 71x. That is, if each support wire 74 of the second support layer 71x is located above the $n^{th}$ mask wire $72x(n)$ from one end of the second mask layer $70x$ in the Y-axis direction, each support wire 74 of the second support layer $71x$ is located below the $(n-1)^{th}$ mask wire $72x(n-1)$ and the $(n+1)^{th}$ mask wire $72x(n+1)$ that adjoin the mask wire $72x(n)$ in the second mask layer $70x$. Each support wire 74 of the second support layer $71x$ is located below the $n^{th}$ mask wire $72w(n)$ of the first mask layer $70w$, and each support wire 74 of the first support layer $71w$ is located above the $(n-1)^{th}$ mask wire $72x(n-1)$ and the $(n+1)^{th}$ mask wire $72x(n+1)$ of the second mask layer $70x$.

Thus, arranging the plurality of support wires 74 in a staggered manner with respect to the plurality of mask wires 72 placed in a tensioned state strengthen support of the mask wires 72 by the support wires 74, and can further prevent displacement of the mask wires 72.

In this case, however, the mask wires 72 are vertically displaced alternately along the Y-axis direction due to the tension applied to each wire. For example, since the support wires 74 are located above the $n^{th}$ mask wire $72w(n)$ of the first mask layer $70w$ and the $n^{th}$ mask wire $72x(n)$ of the second mask wire $70x$, and thus a downward force is applied to the $n^{th}$ mask wire $72w(n)$ of the first mask layer $70w$ and the $n^{th}$ mask wire $72x(n)$ of the second mask wire $70x$, the $n^{th}$ mask wire $72w(n)$ of the first mask layer $70w$ and the $n^{th}$ mask wire $72x(n)$ of the second mask wire $70x$ are relatively displaced downward. On the other hand, since the support wires 74 are located below the mask wires $72w(n-1)$, $72w(n+1)$ of the first mask layer $70w$ and the mask wires $72x(n-1)$, $72x(n+1)$ of the second mask wire $70x$, and thus an upward force is applied to the mask wires $72w(n-1)$, $72w(n+1)$ of the first mask layer $70w$ and the mask wires $72x(n-1)$, $72x(n+1)$ of the second mask wire $70x$, the mask wires $72w(n-1)$, $72w(n+1)$ of the first mask layer $70w$ and the mask wires $72x(n-1)$, $72x(n+1)$ of the second mask wire $70x$ are relatively displaced upward.

Such displacement of the mask wires 72 results in a difference in undesirable deposition width between both sides of the thin film 3 (the element film).

As shown in FIG. 29, since the position of the end of the opening K (the through gap $73a$) is relatively displaced in the vertical direction (the Z-axis direction), one passing angle $\gamma1$ becomes different from the other passing angle $\gamma2$. This results in a difference in undesirable deposition width between both sides of the thin film 3 (the element film). The more the amount of displacement is, the more the difference in undesirable deposition width is.

Thus, the amount of undesirable deposition that is formed on both sides of the thin film 3 (the element film) can be varied by adjusting the amount of displacement between adjoining ones of the mask wires 72. Such adjustment of the amount of displacement can be made based on the physical properties and arrangement of the wires 72, 74, tension applied thereto, etc.

In the case of the third improved mask 60C as well, in order for the through gaps $73a$ to properly function as the openings K, the mask wires 72 and the support wires 74 are placed so that of the deposition particles that enter the gaps 73 in the mask layer 70 located on the side of the deposition source 53, the deposition particles other than those emitted through the gaps 73 in the mask layer 70 located on the side of the substrate 10 are caught by either the mask layer 70 or the support layer 71.

Figure 30:
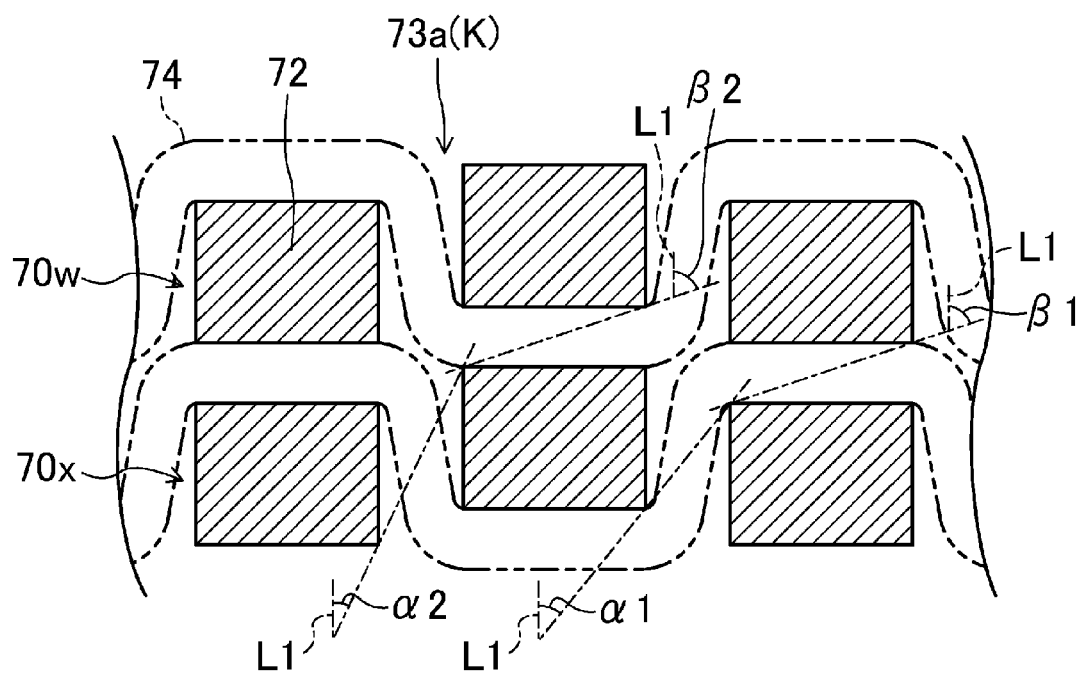
FIG. 30 is an enlarged schematic diagram of a main part in FIG. 29.

As shown in FIG. 30, in the third improved mask 60C as well, the conditions are the same as those of the first improved mask 60A described above etc. except that the passing angle α etc. is different on both sides of the opening K (the through gap $73a$).

That is, the lower side of the figure represents the side of the deposition source 53, and "α1" represents the maximum passing angle at which the deposition particles entering the gap 73 of the second mask layer $70x$ from its one side (the side displaced upward) pass through the gap 73 with respect to the deposition axis L1. "β1" represents the minimum passing angle at which the deposition particles pass through the space between a portion between two adjoining gaps 73 in the second mask layer $70x$ and a portion between two adjoining gaps 73 in the first mask layer $70x$ on the other side. The third improved mask 60C is designed so that the passing angle β1 is larger than the passing angle α1.

Regarding the other side (the side displaced downward) of the gap 73 of the second mask layer $70x$ as well, the third improved mask 60C is similarly designed so that the passing angle β2 is larger than the passing angle α2. Even if the third improved mask 60C has three or more mask layers 70, the third improved mask 60C is similar to the first improved mask 60A etc. (see FIG. 18).

In the third improved mask 60C as well, the wires may have any cross-sectional shape. The support wires 74 need not necessarily be arranged in a staggered manner with respect to every other mask wire 72, and may be arranged in a staggered manner with respect to every plurality of mask wires 72 such as, e.g., every three mask wires 72, 72.

(Third Example)

In this example, as shown in FIG. 27 etc., a third improved mask was configured by two support layers 71 and two mask layers 70, and the support wires 74 are arranged in a staggered manner with respect to the mask wires 72. Wires comprised of an invar material, having a rectangular cross section, and having a width (the Y-axis direction) of 340 μm and a thickness (the Z-axis direction) of 500 μm were used as the mask wires 72. Wires comprised of an invar material and having a 100 μm×100 μm square cross section were used as the support wires 74.

Tension etc. was adjusted so that the mask wires 72 were alternately displaced in the vertical direction by 50 μm with respect to a reference line that is horizontal in the Y-axis direction. The light-emitting layers 25R, 25G, 25B were formed by using the same width, pitch, etc. of the openings K, and the same setting of the deposition apparatus and the same conditions of the deposition process as those of the first example.

As a result, the RGB light-emitting layers 25R, 25G, 25B of each color having a uniform thickness were able to be formed. The undesirable deposition width was about 29 μm on one side, and about 35 μm on the other side.

As described above, according to the deposition mask etc. of the present invention, undesirable deposition can be effectively reduced by a practical method. Thus, the present invention allows high quality, high definition, large-sized organic EL displays to be manufactured.

The deposition mask etc. of the present invention is not limited to the above embodiments, and includes various configurations other than those described above.

For example, the first improved mask 60A etc. may be used only to form the light-emitting layer 25R, 25G, 25B of a specific color. For example, in the case where the influence of undesirable deposition in the green (G) light-emitting layer 25G on the quality can be ignored even if the amount of undesirable deposition is large, the shadow mask 60 before improvement can be used for the green (G) light-emitting layer 25G.

DESCRIPTION OF REFERENCE CHARACTERS

1 Organic EL Display
3 Thin Film
10 Substrate
50 Deposition Apparatus
53 Deposition Source
60 Shadow Mask (Deposition Mask)
   60A First Improved Mask
   60B Second Improved Mask
   60C Third Improved Mask
65 Frame (Mask Support Body)
70 Mask Layer
71 Support Layer
72 Mask Wire
73 Gap
   73a Through Gap
74 Support Wire
K Opening

The invention claimed is:

1. A deposition mask that is used to form a thin film in a prescribed pattern on a substrate by depositing deposition particles through a plurality of openings having a stripe pattern, comprising:
a frame-shaped mask support body;
a plurality of mask layers including at least a first mask layer and a second mask layer, and provided in a frame of the mask support body so as to overlap each other; and
a support layer provided between the first mask layer and the second mask layer, wherein
each of the first mask layer and the second mask layer is formed by arranging in a stripe pattern a plurality of mask wires in a same direction in a tensioned manner on the mask support body,
the support layer is formed by arranging a plurality of support wires in a tensioned manner on the mask support body so as to cross the mask wires,
a plurality of gaps in each of the first mask layer and the second mask layer overlap each other to form a plurality of through gaps that linearly extend through both the first mask layer and the second mask layer,
the plurality of openings are formed by the plurality of through gaps, and
the mask wires of the first mask layer overlap the mask wires of the second mask layers in a vertical direction, so that outlines of the mask wires of the first mask layer match outlines of the mask wires of the second mask layer as the mask wires of the first mask layer and the mask wires of the second mask layers are viewed in a direction perpendicular to the first mask layer and the second mask layer.

2. The deposition mask of claim 1, wherein the plurality of gaps are separated from each other by one of the mask wires.

3. The deposition mask of claim 1, wherein the plurality of gaps are separated from each other by multiple ones of the mask wires.

4. The deposition mask of claim 1, wherein the plurality of support wires are arranged in a staggered manner with respect to the plurality of mask wires.

5. A deposition apparatus, comprising:
the deposition mask of claim 1;
a deposition source that emits the deposition particles;
a mask unit that includes the deposition mask and the deposition source, and maintains a fixed relative positional relation between the deposition mask and the deposition source;
a substrate support apparatus that supports the substrate; and
a moving apparatus that relatively moves at least one of the mask unit and the substrate along a predetermined scanning direction with a constant gap being provided between the substrate and the deposition mask, wherein
the deposition mask is placed so that a direction in which the openings extend is parallel to the scanning direction.

6. The deposition apparatus of claim 5, wherein
the plurality of mask wires and the plurality of support wires are set so that of the deposition particles that enter the gap in the outermost mask layer located on a side of the deposition source, the deposition particles other than those emitted through the gap in the outermost mask layer located on a side of the substrate, which overlaps the gap in the outermost mask layer located on the side of the deposition source, are caught by either the mask layer or the support layer.

7. The deposition apparatus of claim 6, wherein
the plurality of mask layers include in order of the first mask layer and the second mask layer from the side of the deposition source, and
a minimum passing angle at which the deposition particles pass through a space between a portion between adjoining two of the gaps in the first mask layer and a portion between adjoining two of the gaps in the second mask layer, which overlaps the portion between the adjoining two gaps in the first mask layer, is larger than a maximum passing angle at which the deposition particles pass through the gap in the first mask layer, with respect to a reference line perpendicular to the deposition mask, as viewed in the scanning direction.

8. The deposition apparatus of claim 7, further comprising:
a plurality of mask layers stacked next to the second mask layer on the side of the substrate, and
a minimum passing angle at which the deposition particles pass through a space between a portion between adjoining two of the gaps in the $N^{th}$ mask layer and a portion between adjoining two of the gaps in the $(N+1)^{th}$ mask layer, which overlaps the portion between the adjoining two gaps in the $N^{th}$ mask layer, is larger than a maximum passing angle at which the deposition particles pass through the through gap from the first mask layer to the $N^{th}$ mask layer, with respect to the reference line perpendicular to the deposition mask, as viewed in the scanning direction.

9. A deposition apparatus, comprising:
the deposition mask of claim 3;
a deposition source that emits the deposition particles;
a mask unit that includes the deposition mask and the deposition source, and maintains a fixed relative positional relation between the deposition mask and the deposition source;
a substrate support apparatus that supports the substrate; and
a moving apparatus that relatively moves at least one of the mask unit and the substrate along a predetermined scanning direction with a constant gap being provided between the substrate and the deposition mask, wherein
the deposition mask is placed so that a direction in which the openings extend is parallel to the scanning direction, and
an adjusting gap that blocks a passage of the deposition particles is formed in a portion between adjoining two of the gaps in at least the outermost one of the plurality of mask layers, which is located on a side of the deposition source.

10. The deposition apparatus of claim 9, wherein
the plurality of mask wires are arranged so that the deposition particles that enter the adjusting gap are caught by either the mask layer or the support layer.

11. The deposition apparatus of claim 9, wherein
the adjusting gap is closed by a sealing member.

12. A deposition method for forming the thin film in a stripe pattern on the substrate by using the deposition apparatus of claim 5, comprising:
- an aligning step of, with the substrate being supported by the substrate support apparatus and with the gap being provided between the substrate and the deposition mask, aligning the mask unit and the substrate so that the mask unit faces the substrate; and
- a deposition step of forming the thin film by sequentially depositing the deposition particles while relatively moving at least one of the mask unit and the substrate along the predetermined scanning direction by the moving apparatus.

13. The deposition method of claim 12, wherein
- a substrate for an organic EL display in which a plurality of pixels each having a light-emitting region configured to emit light are arranged in a grid pattern is used as the substrate,
- the plurality of openings are placed so as to face a plurality of film formation pixels that are included in the plurality of pixels, and
- the deposition mask is positioned so that each of the light-emitting regions of the film formation pixels is located inside the opening in a lateral direction with a gap therebetween, as viewed in a direction perpendicular to the substrate.

14. The deposition mask of claim 1, wherein
outlines of the plurality of gaps in the first mask layer match outlines of the plurality of gaps in the second mask layer in a vertical direction, as viewed in a direction perpendicular to the first mask layer and the second mask layer.

* * * * *